US006912054B2

(12) United States Patent
Hill

(10) Patent No.: US 6,912,054 B2
(45) Date of Patent: *Jun. 28, 2005

(54) INTERFEROMETRIC STAGE SYSTEM

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 271 days.

This patent is subject to a terminal disclaimer.

(21) Appl. No.: 10/229,297

(22) Filed: Aug. 26, 2002

(65) Prior Publication Data

US 2003/0053074 A1 Mar. 20, 2003

Related U.S. Application Data

(60) Provisional application No. 60/615,574, filed on Aug. 28, 2001.

(51) Int. Cl.[7] .................................................. G01B 9/02
(52) U.S. Cl. ....................................... 356/500; 356/508
(58) Field of Search ................................ 356/486, 493, 356/498, 500, 509, 510, 508

(56) References Cited

U.S. PATENT DOCUMENTS

| 4,606,638 | A |   | 8/1986  | Sommargren    |         |
|-----------|---|---|---------|---------------|---------|
| 4,662,750 | A |   | 5/1987  | Barger        |         |
| 4,711,573 | A |   | 12/1987 | Wijntjes et al. |       |
| 4,742,286 | A | * | 5/1988  | Phillips      | 318/640 |
| 4,790,651 | A |   | 12/1988 | Brown et al.  |         |
| 4,802,765 | A |   | 2/1989  | Young et al.  |         |
| 4,859,066 | A |   | 8/1989  | Sommargren    |         |
| 4,881,816 | A |   | 11/1989 | Zanomi        |         |
| 5,064,289 | A |   | 11/1991 | Bockman       |         |
| 5,114,234 | A |   | 5/1992  | Otsuka et al. |         |
| 5,187,543 | A |   | 2/1993  | Ebert         |         |
| 5,408,318 | A |   | 4/1995  | Slater        |         |
| 5,491,550 | A |   | 2/1996  | Dabbs         |         |
| 5,724,136 | A |   | 3/1998  | Zanoni        |         |
| 5,757,160 | A |   | 5/1998  | Kreuzer       |         |
| 5,764,361 | A |   | 6/1998  | Kato et al.   |         |
| 5,781,277 | A |   | 7/1998  | Iwamoto       |         |
| 5,781,297 | A |   | 7/1998  | Castore       |         |
| 5,801,832 | A |   | 9/1998  | Van Den Brink |         |

(Continued)

FOREIGN PATENT DOCUMENTS

| JP | 7-351078    | 12/1995 |
|----|-------------|---------|
| JP | 8-117083    | 4/1996  |
| JP | 10 260009   | 9/1998  |
| WO | WO 00/66969 | 11/2000 |

OTHER PUBLICATIONS

Badami, V.G. et al. "Investigation of Nonlinearity in High Accuracy Heterodyne Laser Interferometry." *American Society for Precision Engineering 1997 Proceedings*, 16:pp. 153–156, 1997.

(Continued)

*Primary Examiner*—Gregory J. Toatley, Jr.
*Assistant Examiner*—Patrick Connolly
(74) *Attorney, Agent, or Firm*—Fish & Richardson P.C.

(57) ABSTRACT an apparatus including: a support structure; a stage configured to move relative to the support structure; a first reflection surface carried by one of the support structure and the stage; and a first interferometry system. The first interferometry system is configured to direct a first measurement beam to contact the first reflection surface and monitor changes in the position and orientation of the stage relative to the support structure along multiple degrees of freedom using the first measurement beam and no other measurement beam that contacts the first reflection surface. For example, the first measurement beam can define a first measurement axis and the multiple degrees of freedom can include at least two of: distance along the first measurement axis, pitch about the first measurement axis, and yaw about the first measurement axis.

43 Claims, 15 Drawing Sheets

U.S. PATENT DOCUMENTS

| | | | |
|---|---|---|---|
| 6,020,964 | A | 2/2000 | Loopstra et al. |
| 6,046,792 | A | 4/2000 | Van Der Werf et al. |
| 6,134,007 | A | 10/2000 | Naraki et al. |
| 6,201,609 | B1 | 3/2001 | Hill et al. |
| 6,208,424 | B1 | 3/2001 | de Groot |
| 6,236,507 | B1 | 5/2001 | Hill et al. |
| 6,252,667 | B1 * | 6/2001 | Hill et al. ............... 356/487 |
| 6,271,923 | B1 | 8/2001 | Hill |
| 6,304,318 | B1 | 10/2001 | Matsumoto |
| 6,313,918 | B1 | 11/2001 | Hill et al. |
| 6,541,759 | B1 | 4/2003 | Hill |
| 2003/0053073 | A1 * | 3/2003 | Hill ............... 356/498 |
| 2003/0053074 | A1 | 3/2003 | Hill |

OTHER PUBLICATIONS

Bennett, S.J. "A Double–Passed Michelson Interferometer." *Optics Communications*, 4:6, pp. 428–430, 1972.

Bobroff, Norman. "Recent advances in displacement measuring interferometry." *Meas. Sci. Technol*, 4: pp. 907–926, 1993.

Hines, Brad et al. "Sub–Nanometer Laser Metrology—Some Techniques and Models." *European Southern Observatory, ESO Conference*, pp. 1195–1204, 1991.

Oka, K. et al. "Polarization heterodyne interferometry using another local oscillator beam." *Optics Communications*, 92:pp 1–5, 1992.

Wu, Chien–Ming. Analytical modeling of the periodic nonlinearity in heterodyne interferometry. *Applied Optics*, 37:28 pp. 6696–6700, 1998.

* cited by examiner

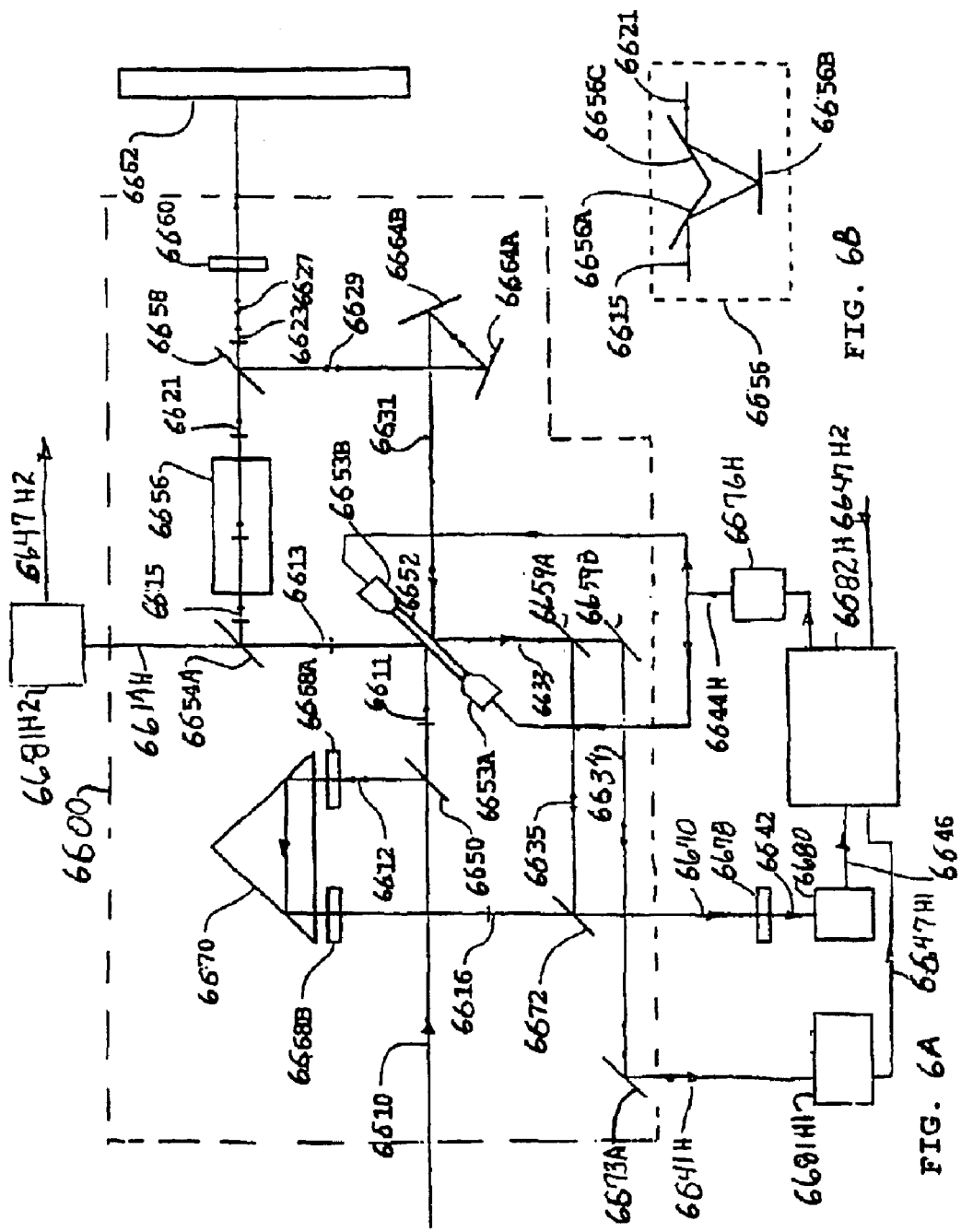

INTERFEROMETRIC STAGE SYSTEM

CROSS-REFERENCE TO RELATED APPLICATIONS

This application claims priority to Provisional Patent Application 60/315,574, entitled "LITHOGRAPHY APPARATUS INCLUDING INTERFEROMETRY SYSTEMS," to Henry A. Hill, filed on Aug. 28, 2001.

BACKGROUND

This invention relates to interferometers, e.g., displacement measuring and dispersion interferometers that measure angular and linear displacements of a measurement object such as a mask stage or a wafer stage in a lithography scanner or stepper system.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change substantially equal to a distance change L of $\lambda/(np)$, where L is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors can also be present.

There are also "non-cyclic non-linearities" such as those caused by a change in lateral displacement between the reference and measurement beam components of an output beam of an interferometer when the wavefronts of the reference and measurement beam components have wavefront errors. The lateral displacement between the beam components is also referred to as "relative beam shear" or "differential beam shear." Relative beam shear causes non-cyclic, non-linearities for the following reasons.

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems relative beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the relative beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the relative beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

Note that in addition to "relative beam shear," one can also refer to "average beam shear" or "common mode shear," which refer to a change in the average lateral position of a beam as a whole. For example, in some interferometric arrangements the beam as a whole (including both reference and measurement components) may undergo a change in its lateral position ("common mode beam shear") in response to a change in the orientation of a measurement object or in response to a change in orientation of a fold mirror.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

The interferometers described above are often crucial components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In many lithography systems and other applications, the measurement object includes one or more plane mirrors to reflect the measurement beam from each interferometer. Small changes in the angular orientation of the measurement object, e.g., pitch and yaw of a stage, can alter the direction of each measurement beam reflected from the plane mirrors. If left uncompensated, the altered measurement beams reduce the overlap of the exit measurement and reference beams in each corresponding interferometer. Furthermore, these exit measurement and reference beams will not be propagating parallel to one another nor will their wave fronts be aligned when forming the mixed beam. As a result, the interference between the exit measurement and reference beams will vary across the transverse profile of the mixed beam, thereby corrupting the interference information encoded in the optical intensity measured by the detector.

To address this problem, many conventional interferometers include a retroreflector that redirects the measurement beam back to the plane mirror so that the measurement beam "double passes" the path between the interferometer and the measurement object. The presence of the retroreflector insures that the direction of the exit measurement is insensitive to changes in the angular orientation of the measurement object, at least for a practical range of orientation angles.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbe offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

To measure each degree of freedom, an interferometer is used to monitor distance changes along a corresponding metrology axis. For example, in systems that measure the x and y positions of the stage as well as the angular orientation of the stage with respect to the x, y, and z axes, at least three spatially separated measurement beams reflect from one side of the wafer stage and at least two spatially separated measurement beams reflect from another side of the wafer stage. See, e.g., U.S. Pat. No. 5,801,832 entitled "METHOD OF AND DEVICE FOR REPETITIVELY IMAGING A MASK PATTERN ON A SUBSTRATE USING FIVE MEASURING AXES." Each measurement beam is recombined with a reference beam to monitor optical path length changes along the corresponding metrology axes. Because the different measurement beams contact the wafer stage at different locations, the angular orientation of the wafer stage can then be derived from appropriate combinations of the optical path length measurements. Accordingly, for each degree of freedom to be monitored, the system includes at least one measurement beam that contacts the wafer stage. Furthermore, as described above, each measurement beam may double-pass the wafer stage to prevent changes in the angular orientation of the wafer stage from corrupting the interferometric signal. The measurement beams may be generated from physically separate interferometers or from multi-axes interferometers that generate multiple measurement beams.

SUMMARY

In general, in one aspect, the invention features an apparatus including: a support structure; a stage configured to move relative to the support structure; a first reflection surface carried by one of the support structure and the stage; and a first interferometry system. The first interferometry system is configured to direct a first measurement beam to contact the first reflection surface and monitor changes in the position and orientation of the stage relative to the support structure along multiple degrees of freedom using the first measurement beam and no other measurement beam that contacts the first reflection surface. For example, the first measurement beam can define a first measurement axis and the multiple degrees of freedom can include at least two of: distance along the first measurement axis, pitch about the first measurement axis, and yaw about the first measurement axis.

Embodiments of the apparatus may include any of the following features.

The first interferometry system may combine at least portion of the first measurement beam reflected from the first reflection surface with a reference beam to produce an interferometric signal indicative of a change in optical path length.

The first interferometry system can include a single measurement beam interferometer (SMBI) which during operation maintains the first measurement beam normal to the first reflection surface over a range of angular orientations of the stage relative to the support structure. The SBMI in the first interferometry system may direct the first measurement beam to contact the first reflection surface only once. Alternatively, the SBMI in the first interferometry system may direct the first measurement beam to contact the first reflection surface multiple times.

The SMBI in the first interferometry system may determine an angular orientation of the stage relative to the support structure based information related to the direction of the measurement beam. For example, the SMBI may include an angle measuring interferometer to interferometrically monitor the direction of the measurement beam.

The SMBI may be a passive SMBI which is configured to direct an input beam to reflect at least once from the first reflection surface and then separate the input beam into the first measurement beam and at least one other beam. Furthermore, the passive SMBI may include a beam conditioning portion for directing the input beam to reflect from the first reflection surface and an afocal magnification or demagnification system to scale the change in propagation direction imparted to the input beam after it reflects from the first reflection surface.

The SMBI may be a dynamic SMBI which includes a dynamic beam steering element that is servo-ed to the orientation of the first reflection surface to maintain the first measurement beam normal to the first reflection surface over the range of angular orientations of the stage relative to the support structure. For example, the dynamic beam steering element can be positioned to direct and contact the first measurement beam. Alternatively, the dynamic beam steering element may be positioned to direct and contact a progenitor beam to the first measurement beam. Furthermore, the dynamic beam steering element may be responsive to a servo signal derived from a measurement of the propagation directions of the first measurement beam or a beam derived from the first measurement beam after it has reflected from the first reflection surface.

The apparatus may further include a drive system for moving the stage relative to the support structure.

The first interferometry system may be secured to the support structure and the first reflection surface may be carried by the stage. Instead, the first interferometry system may be secured to the stage and the first reflection surface may be carried by the support structure.

The apparatus may further include a mirror having the first reflection surface, the mirror being secured to either the stage or the support structure. Instead, the first reflection surface may be formed by a reflecting edge surface of the stage or support structure.

The first interferometry system may include a photodetector for measuring an interferometric optical signal.

The first interferometry system may include a fiber optic pick-up for coupling an interferometric optical signal to a remote photodetector.

The stage may be configured to support a semiconductor wafer.

The stage may be configured to support a mask.

The apparatus may further include an illumination source for directing radiation onto an object supported by the stage.

The apparatus may further include: a second reflection surface carried by one of the support structure and the stage, the second reflection surface having an orientation different than that of the first reflection surface, and a second interferometry system configured to direct a second measurement beam to contact the second reflection surface and monitor changes in the position and orientation of the stage relative to the support structure along multiple degrees of freedom using the second measurement beam and no other measurement beam that contacts the second reflection surface.

The apparatus may further include a light source providing an input beam to each of the first and second interferometry systems.

The first and second reflection surfaces may be each positioned on different sides of the stage. Furthermore, the first and second interferometry systems may be each secured to the support structure.

The first and second reflection surfaces may be each carried by the support structure and have substantially orthogonal orientations. Furthermore, the first and second interferometry systems may be each secured to the stage.

The first and second interferometry systems may monitor changes in the position of the stage relative to the support structure along five degrees of freedom. For example, the five degrees of freedom may be distance along each of two orthogonal axes, orientation about each of the two orthogonal axes, and an orientation about a third axis that is orthogonal to each of the first two orthogonal axes.

The first and second interferometry systems may share common optics.

The apparatus may further include a third interferometry system for monitoring translations of the stage along an azimuthal direction.

In general, in another aspect, the invention features an apparatus including: an object stage for carrying an object, the stage lying predominantly in the x-y plane of a Cartesian coordinate system; a drive for moving the object stage in at least the x-direction, the y-direction, and a rotation about the z-axis; and an interferometry system configured to monitor changes in the position of the stage along each of the x- and y-axes and changes in orientation about each of the x-, y-, and z-axes using fewer than five measurement axes.

Embodiments of the apparatus may include any of the following features.

The interferometry system may include interferometer mirrors positioned relative to two edges of the stage. For example, the interferometer mirrors may be reflecting edge surfaces of the stage. Instead, the interferometer mirrors may be stick mirrors attached to the stage.

The interferometry system may further include interferometer mirrors formed on a reference support structure. Furthermore, the interferometry system may be carried by the stage. Alternatively, the interferometry system may be secured to a second reference support structure.

Finally, the apparatus may further include an interferometer configured to monitor the z-position of the stage.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the apparatus, methods, and examples are illustrative only and not intended to be limiting.

Other features and advantages of the invention will be apparent from the following detailed description, and from the claims.

DESCRIPTION OF DRAWINGS

The invention will now be further described merely by way of example with reference to the accompanying drawings in which:

FIGS. 6A–6B are schematic diagrams of a dynamic SBMI interferometry system.

Like reference symbols in the various drawings indicate like elements.

DETAILED DESCRIPTION

Figure 1A:
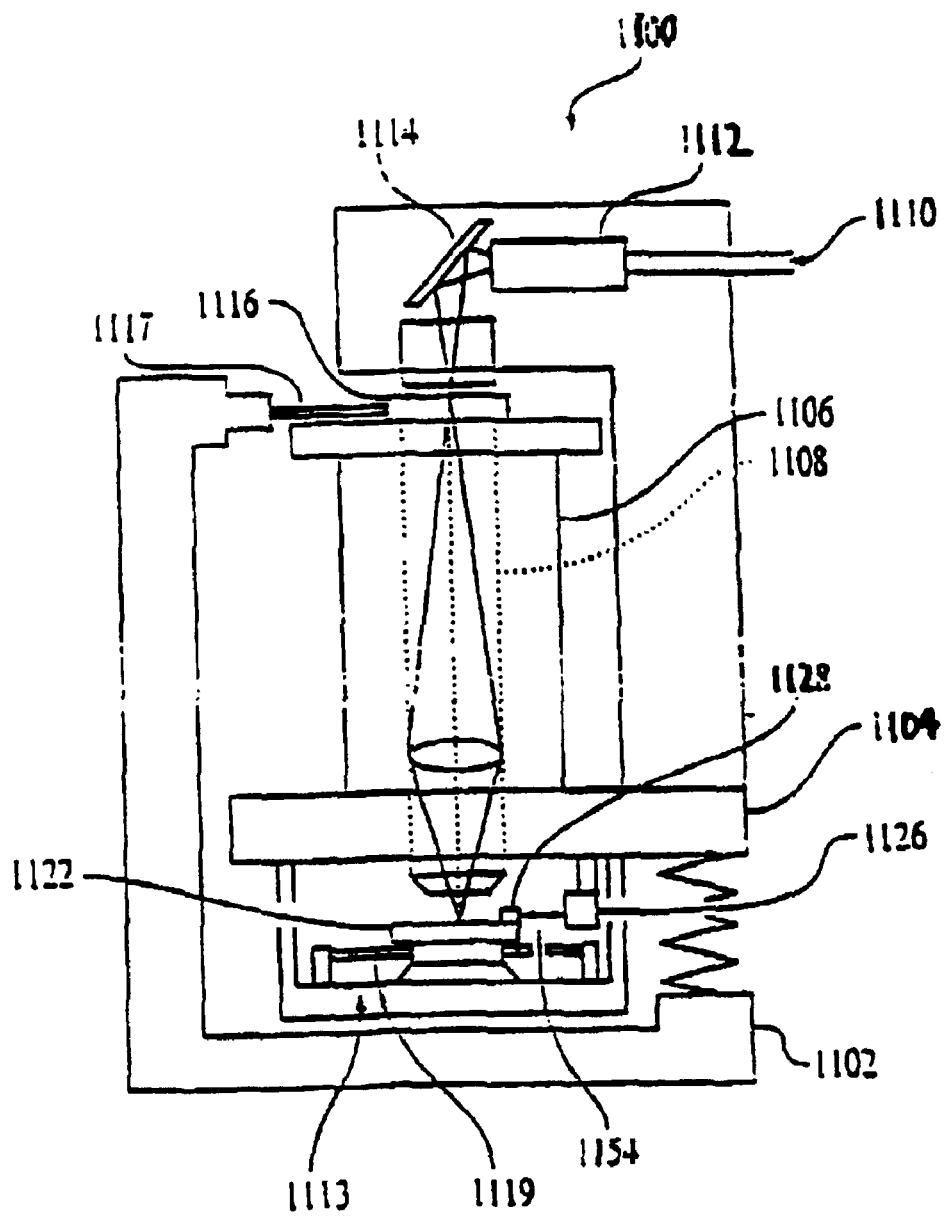
FIG. 1A is schematic diagram of a lithography system used to make integrated circuits.

In certain aspects, the invention features a translatable stage system for positioning an object such as a wafer or a mask. The stage system includes one or more interferometry systems for monitoring the position of the stage relative to a reference frame. Each interferometry system monitors the position of the stage along multiple degrees of freedom using only a single measurement beam. Such interferometry systems will hereinafter be referred to as single measurement beam interferometers (SMBI). For example, one SMBI can direct its measurement beam to contact one edge of the wafer stage and determine changes in the distance to the wafer stage along the measurement beam axis as well as pitch and yaw with respect to that axis. Thus, for example, two SMBI's, each contacting a different edge of the wafer stage, can be used to measure the x and y positions of the stage as well as the angular orientation of the stage with respect to the x, y, and z axes, wherein the stage is assumed to lie substantially in the x-y plane.

A SMBI is an interferometry system that maintains its measurement beam normal to the plane mirror of a measurement object over a range of angular orientations of the measurement object. Because the measurement beam is maintained substantially normal to the plane mirror, a double pass of the measurement beam to the plane mirror is not necessary to provide accurate optical path length measurements. Thus, in some embodiments, the SMBI directs the measurement beam to make only a single pass to the plane mirror. In other embodiments, however, multiple passes are still possible. In any case, at least a portion of the measurement beam reflected from the plane mirror is combined with a reference beam to produce an interferometric signal indicative of a change in optical path. Furthermore, because the measurement beam is maintained substantially normal to the plane mirror, the propagation direction of the measurement beam relative to the interferometer reference frame is indicative of the angular orientation of the measurement object. Thus, the direction of the measurement beam, or a beam derived from the measurement beam can be monitored to determine the angular orientation of the measurement object. Furthermore, in some embodiments, the direction of a portion of an input beam from which the measurement beam is derived may be used to determined the angular orientation of the measurement beam. In any case, the direction may be derived interferometrically by using an angle measuring interferometers or interferometers based on, e.g., an etalon or grating pair. Angle measuring interferometers include differential angle displacement interferometers and angle displacement interferometers. Differential angle displacement interferometers determine the difference in propagation directions between beams. Angle displacement interferometers monitor the average propagation direction of one or more beams relative to a reference direction. As an alternative to angle measuring interferometers, beam direction may be derived by using a multielement photo-detector and imaging optics. Thus, by maintaining the measurement normal to the plane measurement mirror, the SMBI can provide pitch, yaw, and distance (PYD) measurements using a single measurement beam.

To maintain the measurement beam normal to the plane mirror, the SMBI may be passive or dynamic. Passive embodiments of the SMBI include a beam conditioning portion in which an input beam (including, e.g., spatially separated components of the input beam) is directed to reflect at least once from the plane measurement mirror to produce a conditioned input beam, and an interferometer portion. Thus, information about the angular orientation of the plane measurement mirror is imparted to the conditioned input beam. The beam conditioning portion may further include an afocal magnification or demagnification system to scale the change in propagation direction imparted to the conditioned input beam. The conditioned input beam is then directed to an interferometer portion, which separates the conditioned input beam into the measurement beam and a reference beam. By directing the input beam to contact, at least once, the plane measurement mirror, the beam conditioning portion imparts a propagation direction to the conditioned input beam that causes the measurement beam in the interferometer portion to contact the plane measurement mirror at normal incidence.

Dynamic embodiments of the SMBI include a dynamic beam steering element that is servo-ed to the orientation of the plane measurement mirror to cause the measurement beam to contact the plane measurement mirror at normal incidence. The dynamic element may direct the measurement beam, or a progenitor beam to the measurement beam, such as the input beam. The servo signal used to control the dynamic element may be derived from a measurement of the propagation direction of the measurement beam, or a beam derived from the measurement beam, after it has reflected from the plane measurement mirror.

In some cases, it may be useful to consider a passive SMBI as an example of a dynamic SMBI in which plane measurement mirror itself acts as the dynamic element.

Embodiments of the SMBI's and their use in stage metrology systems also include many advantages. Embodiments include those that minimize beam shear between the measurement and reference components both within the interferometer portion and at the output detector or a fiber optic pick-up (FOP). As described above, such beam shear can produce non-cyclic errors that degrade the interferometric measurement. The reduction in beam shear is based on maintaining the measurement beam normal to the plane measurement mirror. In contrast, for example, even when an interferometer uses a retroreflector to double pass the plane measurement mirror (i.e., as in a high-stability plane mirror interferometer) and insure that the direction of the exit measurement is insensitive to changes in the angular orientation of the measurement object, the lateral position of the exit measurement beam and the path of the measurement beam through the optics of the interferometer remain sensitive to changes in the angular orientation of the measurement object when the measurement beam is not maintained substantially normal to the plane measurement mirror. Furthermore, embodiments of the interferometer portion of the SMBI can be configured as single pass interferometers, in which the measurement beam contacts the plane measurement mirror only once, which tend to reduce the causes of cyclic errors.

The stage system including the SMBI's may be used in microlithography tools for making integrated circuits. For example, the stage systems may be used to position a wafer relative to an illumination pattern of radiation. Furthermore, the stage system may be used to a position a mask stage relative to a source of the radiation, wherein the mask is used to generate the illumination pattern. The stage systems may also be used in beam writing systems for, e.g., the deep-UV or for radiation employing electron or ion beams, to position a target sample relative to the beam.

The plane mirrors formed on the edges of the stage may be separate "stick" mirrors attached to the stage. Alternatively, the plane mirrors may themselves be polished edge faces of the stage. In other words, the plane mirrors and the stage may form a monolithic structure.

Furthermore, in additional embodiments, one or more of the SMBI's may be located on the wafer stage and the corresponding plane measurement mirrors may be attached to the lithographic support structure. Moreover, in yet further embodiments, the reference plane mirror for the SMBI may move relative to the interferometer portion, so that PYD is measured with respect to two moving objects (e.g., the wafer stage and a lens assembly). This is sometimes referred to as a "column reference." Also, the SMBI may include one or more photo-detectors for measuring the interferometric signals, or alternatively, the SMBI may include one or more fiber optic pickups (FOP's) for coupling the optical interferometric signals to corresponding, remote photo-detectors. The latter may be preferable where heat or weight generated by the presence of the photo-detectors is a concern.

Because of the one or more SMBI's, the stage system monitors the position and orientation of the stage up to a number of degrees of freedom that exceed the number of interferometric measurement axes (i.e., the number of distinct measurement beams contacting the stage). For example, a single SMBI can monitor up to three degrees of freedom (PYD) using only a single measurement axes. Furthermore, two SMBI can monitor PYD for two different sides of the stage using two measurement axes, resulting in five degrees of freedom (because the two PYD measurements are redundant with respect to one coordinate). Finally, azimuth translations of the stage (i.e., translation along the z-axis) can also be monitored with an additional SMBI, a Z-interferometer (described subsequently), or a conventional interferometer. Therefore, in these three examples, one, two, and three measurement axes are used to monitor three, five, and six degrees of freedom, respectively. A common light source may be used for one of more of the interferometers.

Before describing the stage positioning systems in greater detail, we first described their use in lithography and beam writing, e.g., for use in fabricating large scale integrated circuits such as computer chips and the like.

Lithography is the key technology driver for the semiconductor manufacturing industry. Overlay improvement is one of the five most difficult challenges down to and below 100 nm line widths (design rules), see, for example, the *Semiconductor Industry Roadmap*, p82 (1997).

Overlay depends directly on the performance, i.e., accuracy and precision, of the distance measuring interferometers used to position the wafer and reticle (or mask) stages. Since a lithography tool may produce $50–100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems, e.g., SMBI's, can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components. Furthermore, a column reference may be used whereby the interferometry system is used to measure changes between two other components that move relative to the interferometry system.

An example of a lithography scanner 1100 using an interferometry system 1126 is shown in FIG. 1A. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technoloy*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more interferometry systems can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference minor (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 1B:
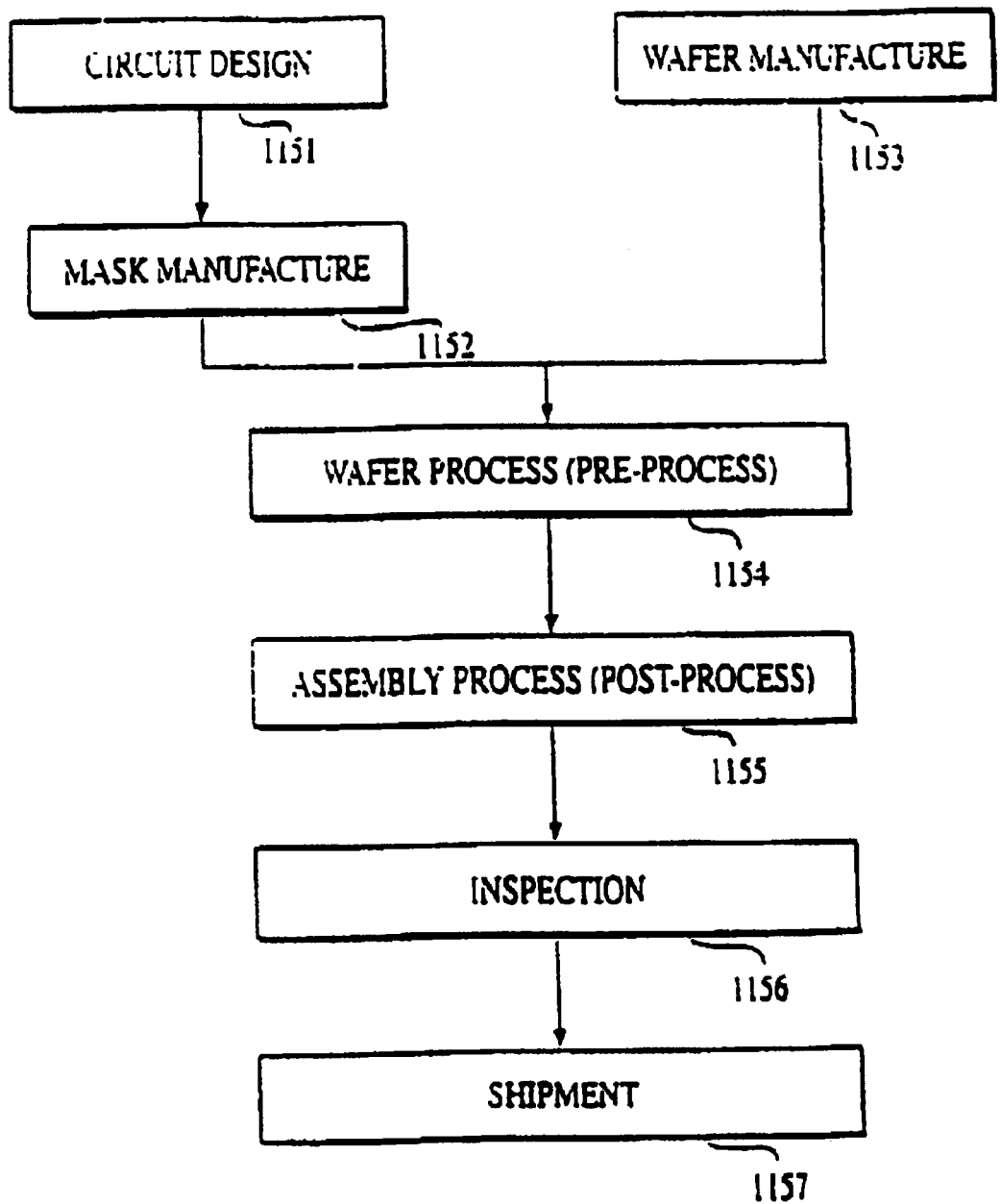
FIGS. 1B–1C are flow charts that described steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 1B and 1C. FIG. 1B is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 1C:
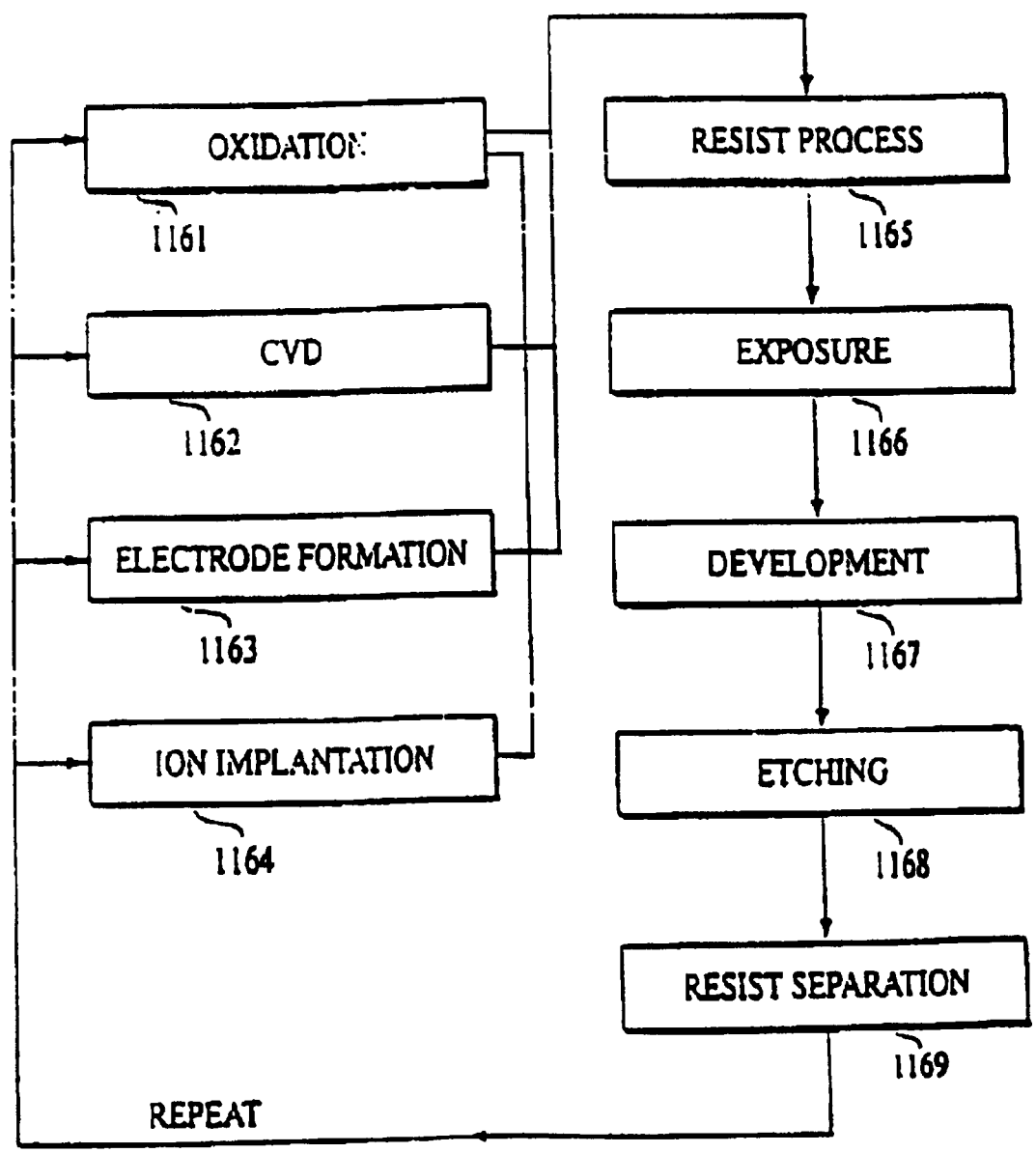

FIG. 1C is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The stage positioning systems may also be used in other applications in which the relative position of an object needs to be measured precisely. For example, in applications in which a write beam such as a laser, x-ray, ion, or electron beam, marks a pattern onto a substrate as either the substrate or beam moves, interferometry systems including one or more interferometry systems can be used to measure the relative movement between the substrate and write beam.

Figure 2:
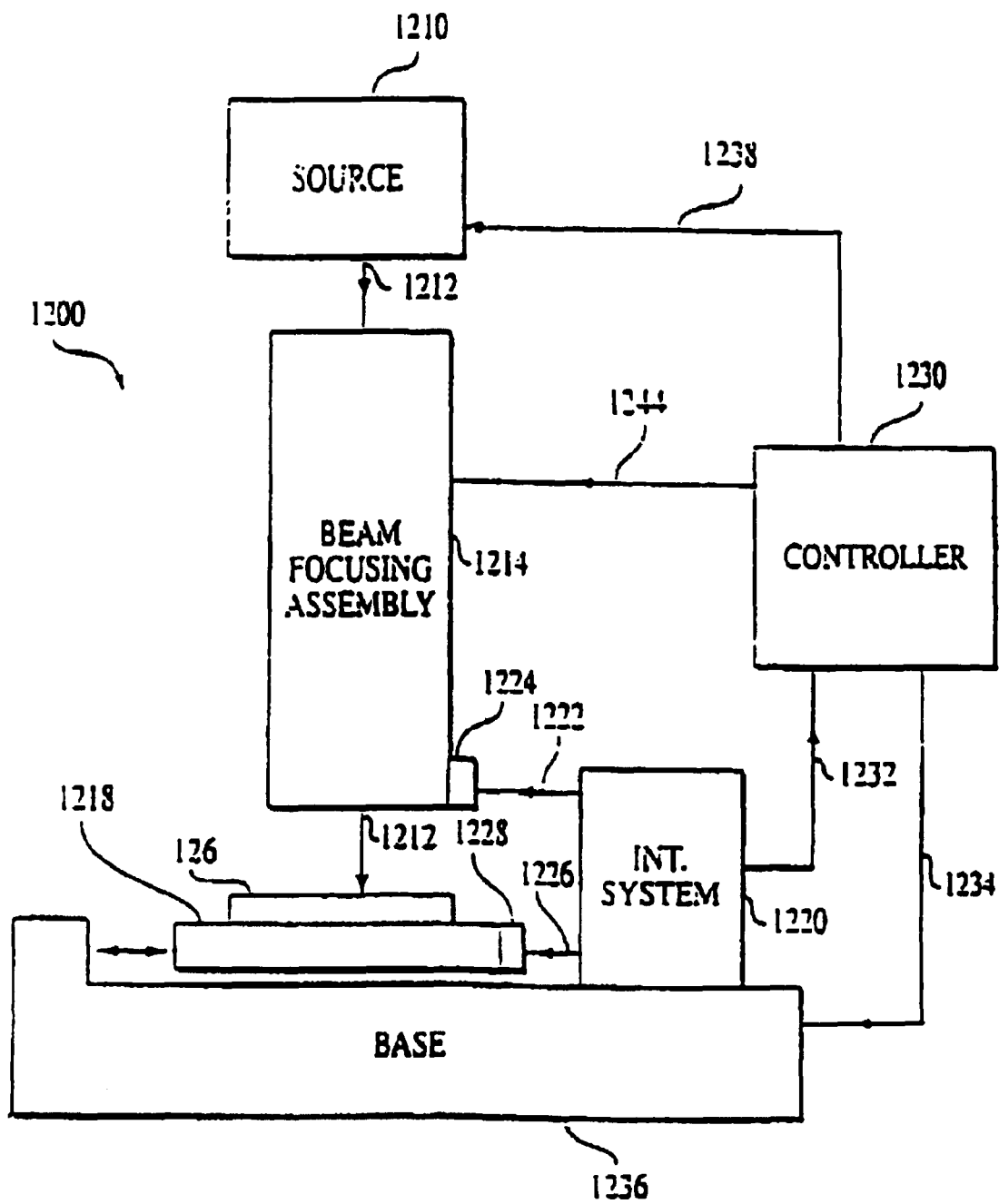
FIG. 2 is a schematic of a beam writing system.

As an example, a schematic of a beam writing system 1200 is shown in FIG. 2. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

Figure 3:
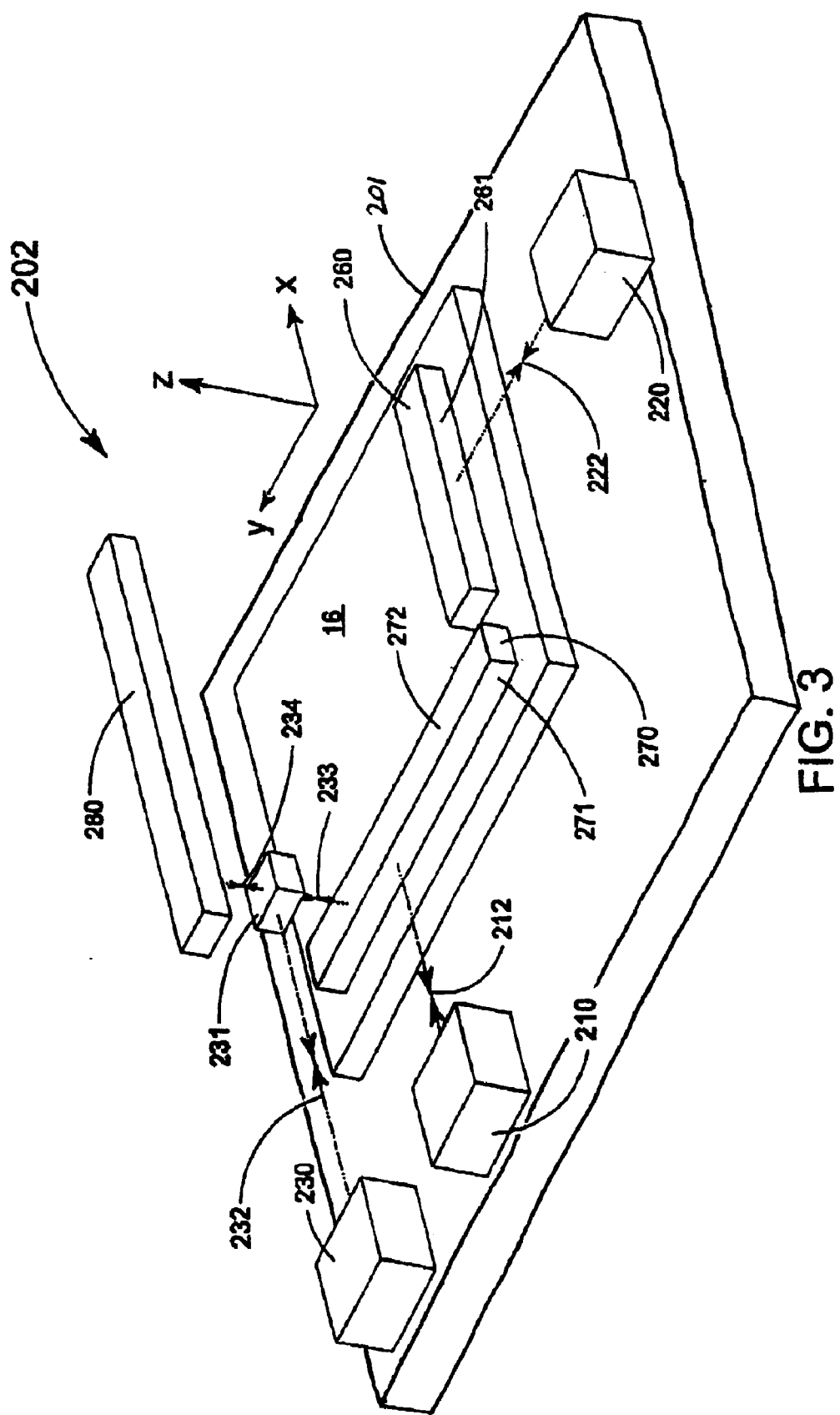
FIG. 3 is a perspective diagram of one embodiment of a stage system employing interferometers.

Referring to FIG. 3, an embodiment is shown of a stage positioning system 202, including SMBI's, that monitors six degree of freedom (DOF) stage 16. Stage 16 is coupled to a drive system (not shown) that positions stage 16 relative to a support structure 201, within the Cartesian coordinate system shown in FIG. 3. Stage positioning system 202 may be used, for example, to position the mask or wafer in the lithography tool of FIG. 1A or the substrate support of the beam writing system of FIG. 2. System 202 includes SMBI's 210 and 220, which are secured to support structure 201.

SMBI 210 directs a measurement beam 212 to a stage mirror 272 attached to stage 16 to define a first measurement axis. Measurement beam 212 reflects from plane surface 271 of mirror 272 and returns to SMBI 210, which maintains measurement beam 212 nominal to surface 271. Measurement beam 212 is combined with a reference beam in interferometer 210 to produce an interferometric signal indicative of changes in the optical path length to mirror 272, which corresponds to translations of the stage 16 along the x-axis. Furthermore, because SMBI maintains measurement beam 212 normal to surface 271, the propagation direction of measurement beam 212, a beam derived from measurement beam 212, or a progenitor beam for measurement beam 212 (e.g., the conditioned input beam) is monitored within SMBI 210 to determine the pitch and yaw of stage 16 with respect to the first measurement axis (i.e., rotations about the z- and y-axes).

To maintain measurement beam 212 normal to surface 271, SMBI 210 may be a passive SMBI, in which case it directs an input beam to contact surface 271 at least one time (such contact not being shown in FIG. 3) to produce a conditioned input beam. The conditioned input beam includes a reference beam component and a measurement beam component, wherein measurement beam 212 is derived from the measurement beam component. The conditioned input beam imparts information about the orientation of surface 271 to measurement beam 212 to cause measurement beam 212 to be normal to surface 271.

SMBI 220 is similar to SMBI 210. It directs a measurement beam 222 to a stage mirror 260 attached to stage 16 to define a second measurement axis. Measurement beam 222 reflects from plane surface 261 of mirror 260 and returns to SMBI 220, which maintains measurement beam 222 normal to surface 261. Measurement beam 222 is combined with a reference beam in interferometer 220 to produce an interferometric signal indicative of changes in the optical path length to mirror 272, which corresponds to translations of the stage 16 along the y-axis. Furthermore, because SMBI maintains measurement beam 222 normal to surface 261, the propagation direction of measurement beam 222, a beam derived from measurement beam 222, or a progenitor beam for measurement beam 222 (e.g., the conditioned input beam) is monitored within SMBI 220 to determine the pitch and yaw of stage 16 with respect to the second measurement axis (i.e., rotations about the z- and x-axes). Additional features of SMBI 220 are the same as those described above for SMBI 210. It is also noted that in additional embodiments, only one of SMBI 210 and SMBI 220 need to be configured to monitor rotations about the z-axis, which is otherwise a redundantly measured degree of freedom.

Stage system 202 further includes a third interferometer 231 for measuring translations of stage 16 along the z-axis relative to a reference portion 280. For example, reference portion 280 may be part of the lens assembly 1106 of FIG. 1A or part of the beam focusing assembly 1214 of FIG. 2. Interferometer 231 receives an input beam from source/detector 230 and generates a measurement beam that propagates along paths 233 and 234 to define a third measurement axis for the system 202. Interferometer 231 directs the measurement beam to make a single pass to each of mirror 272 and a reflective portion of reference 280. Interferometer 231 thereafter combines the measurement beam with a reference beam to produce an output beam, which it directs to photo-detector 230. Details of interferometer 231 are disclosed in FIGS. 4A and 4A of commonly owned U.S. patent application Ser. No. 09/853,114 by Henry Allen Hill entitled "IN-SITU MIRROR CHARACTERIZATION" and filed May 10, 2001.

In additional embodiments, stage system 202 may replace interferometer 231 and source/detector 230 with any of the altitude measuring interferometers ("z-interferometers") disclosed in commonly owned U.S. patent application Ser. No. 09/852,898 by Henry Allen Hill entitled "INTERFEROMETRIC APPARATUS AND METHOD(S) FOR PRECISION MEASUREMENT OF ALTITUDE ABOVE A SURFACE" and filed May 10, 2001. Furthermore, in additional embodiments, interferometer 231 and source/detector 230 may be replaced with a conventional distance measuring interferometer attached to reference portion 280 and directing a measurement beam along the z-axis to a reflective portion of stage 16. Alternatively, the conventional interferometer may be positioned to direct a measurement beam to propagate along the x-axis to contact a 45 degree bevel on surface 271 that redirects the measurement beam along the z-axis to contact a reflective portion of the bottom face of reference 280, which in turn reflects the measurement beam back to the conventional interferometer. Of course a similar configuration may implemented along the y-axis rather than the x-axis.

Furthermore, in additional embodiments, the stage positioning system may be implemented to monitor less than six degrees a freedom. For example, such embodiments may not include measurements along the z-axis, or one of the SMBI's may replaced with one or more conventional interferometers, or removed altogether.

Also, in additional embodiments, one or more of mirrors 260 and 272 may be replaced by monolithic reflective surface on the corresponding edges of stage 16. Furthermore, in yet additional embodiments, the SMBI's may be positioned on stage 16 and the reflective plane mirrors may be fixed to a reference support structure. Moreover, the SMBI's may implemented to use a column reference. Finally, the SMBI's may couple the interferometric output beams directly to a photo-detector or to a fiber optic pick-up for remote photo-electric detection.

In some embodiments, SBMI's 210 and 212 can be passive interferometry systems.

In passive interferometry systems, beam shear (e.g., relative beam shear) is reduced (e.g., eliminated) by conditioning an input beam prior to directing the input beam to the interferometer. Conditioning the input beam reduces beam shear associated with changes in the position (e.g., orientation and/or displacement relative to a reference frame) of a measurement object (e.g., plane mirror or retroreflector). Conditioning the input beam refers to adjusting the relative direction of propagation and/or location of the beam relative to a reference beam path to compensate for changes in the beam's path in the interferometer that are introduced by changes in the measurement object position.

Passive interferometry systems typically include a section that conditions properties of an input beam to form a conditioned input beam, which is then directed to an interferometer. The interferometer splits the conditioned input beam into a measurement beam and a reference beam. The beam conditioning section can include components that compensate for changes in the propagation of the measurement beam that would be caused by changes in the orientation of the measurement object. The beam conditioning section can also include components that compensate for absolute beam shear that may be introduced during the beam conditioning to minimize absolute shear of the conditioned input beam at the interferometer.

Other beams can be derived from the conditioned input beam prior to the interferometer. For example, a portion of the conditioned input beam can be directed to a reference detector for determining a reference phase. Alternatively, or additionally, a portion of the conditioned input beam can be directed to an angle interferometer. Angle interferometers can be used to monitor changes in the direction of propagation of the conditioned input beam relative to an optical axis defined by the beam conditioning portion.

For embodiments in which the measurement object is a plane mirror, conditioning the input beam causes the measurement beam to have a direction of propagation that is substantially orthogonal to the reflecting surface of the plane mirror for a range of orientation angles. As the orientation of the measurement object varies within this range of angles, beam conditioning ensures that the measurement beam retains normal incidence at the measurement object. Accordingly, shear between the reference and measurement components both within the interferometer and in the output beam that could result from such changes in measurement object orientation is reduced.

In addition, the reference and measurement beam components of the conditioned input beam have substantially zero shears at the input of one or more interferometers used to measure changes in the position of the measurement object. In other words, the absolute beam shear of the conditioned input beam entering the interferometer can be substantially zero despite changes in the orientation/position of the measurement object.

The measurement object can be used as an integral part of the apparatus in conditioning the input beam to form the conditioned input beam. The input beam is typically directed to contact the measurement object at least once in the conditioning portion of the apparatus. In heterodyne interferometry, both components of the input beam are directed to contact measurement object. Accordingly, any change in the position of the measurement object from a reference position causes a change in the propagation direction/beam location relative a path defined by the reference position.

Figure 4:
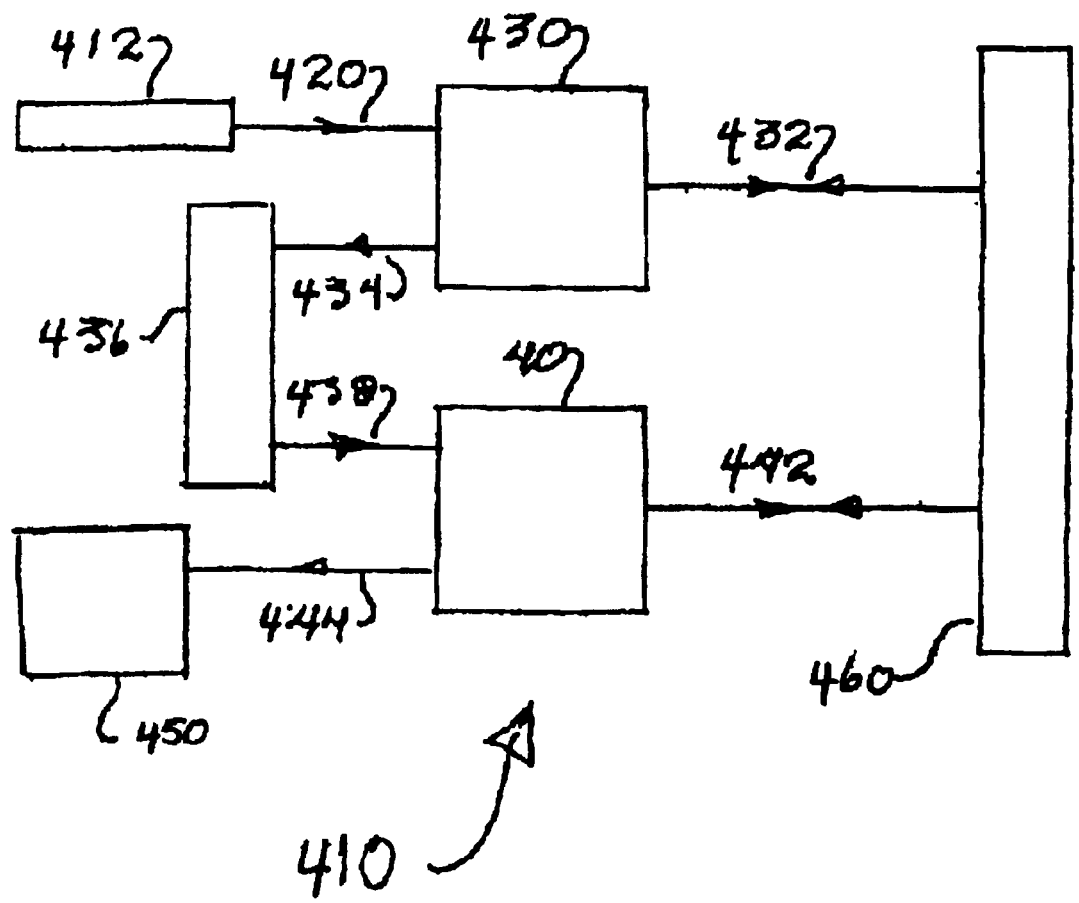
FIG. 4 is a schematic of a passive interferometry system.

Referring to FIG. 4, a passive interferometry system 410 includes a source 412; a beam conditioner 430; an optical relay system 436; interferometer system 440, detector 450, and measurement object mirror 460. Source 412 includes a laser for providing one or more beams 420 to passive interferometer system 410. When using heterodyne interferometry techniques at one or more different wavelengths, source 412 introduces a frequency splitting between components of each beam at the one or more different wavelengths. For example, one or more acousto-optical modulators can be used to introduce the frequency splitting, or alternatively, the source can include a Zeeman-split laser to produce the frequency splitting. Often the frequency-split components are made to have orthogonal polarizations. The frequency-split components can be sent to passive interferometer system 410, where they are separated into measurement and reference beams. Alternatively, source 412 can spatially separate the frequency-split components and send the spatially separated components to passive interferometer system 410, where they become measurement and reference beams.

In the case of an SMBI, interferometer system 440 is a single pass interferometer, however, more generally, interferometer system 440 can be any type of interferometer, e.g., a differential plane mirror interferometer, a double-pass interferometer, a single pass plane mirror interferometer such as described herein with respect to an embodiment of the present invention or a Michelson-type interferometer. Interferometer system 440 can be designed to monitor, for example, changes in optical path length, changes physical path length, changes in refractive index, changes in wavelength of a beam, or intrinsic gas properties along a path length. Interferometer system 440 directs one or more reference beams along corresponding reference paths (which may contact corresponding reference objects) and a corresponding measurement beams along corresponding measurement paths contacting a measurement object at one or more spots (e.g., an extended mirror on a lithography stage), and then combines the corresponding reference and measurement beams to form overlapping pairs of exit beams 444. In dispersion interferometry applications, there are overlapping pairs of exit beams for each of the different wavelengths. In applications measuring changes in distance to an object mirror and changes in orientation of the measurement object mirror, there are overlapping pairs of exit beams for each of the linear and/or angular displacements being measured.

The interference between the overlapping pairs of exit beams contains information about the relative difference in optical path length between the corresponding reference and measurement paths. In some embodiments, the reference paths are fixed and therefore changes in the optical path length differences correspond to changes in the optical path length of the corresponding measurement paths. In other embodiments, however, the optical path length of both the reference and measurement paths can be changing. For example, a reference path can contact a reference object (e.g., a column reference), that may move relative to the interferometer system 440. In this latter case, the changes in the optical path length difference correspond to changes in the position of the measurement object relative to the reference object.

When the reference and measurement beams have orthogonal polarizations, the intensity of at least one intermediate polarization of the overlapping pair of exit beams is selected to produce the optical interference. For example, a polarizer can be positioned within interferometer 440 to mix the polarizations of the overlapping pair of exit beams, which is then sent to detector 450 as a mixed beam 444. Alternatively, the polarizer can be positioned within detector 450. Detector 450 measures the intensity of the selected polarizations of the overlapping pairs of exit beams to produce the interference signals. Portions of the beams can be combined with one another before being directed along the reference and measurement paths to provide a reference pair of overlapping exit beams, which is used to provide a reference interference signal.

Detector 450 includes photodetectors, which measure the intensities of the selected polarizations of the overlapping pairs of exit beams, and electronics such as a preamplifiers and an analog-to-digital converters, which amplify the output from the photodetectors and produce digital signals corresponding to the optical interferences. In dispersion interferometry applications for example, digital signals are produced for each of the overlapping pair of exit beams (which correspond to different wavelengths) by using multiple photodetection channels within detector 450.

Figure 5:
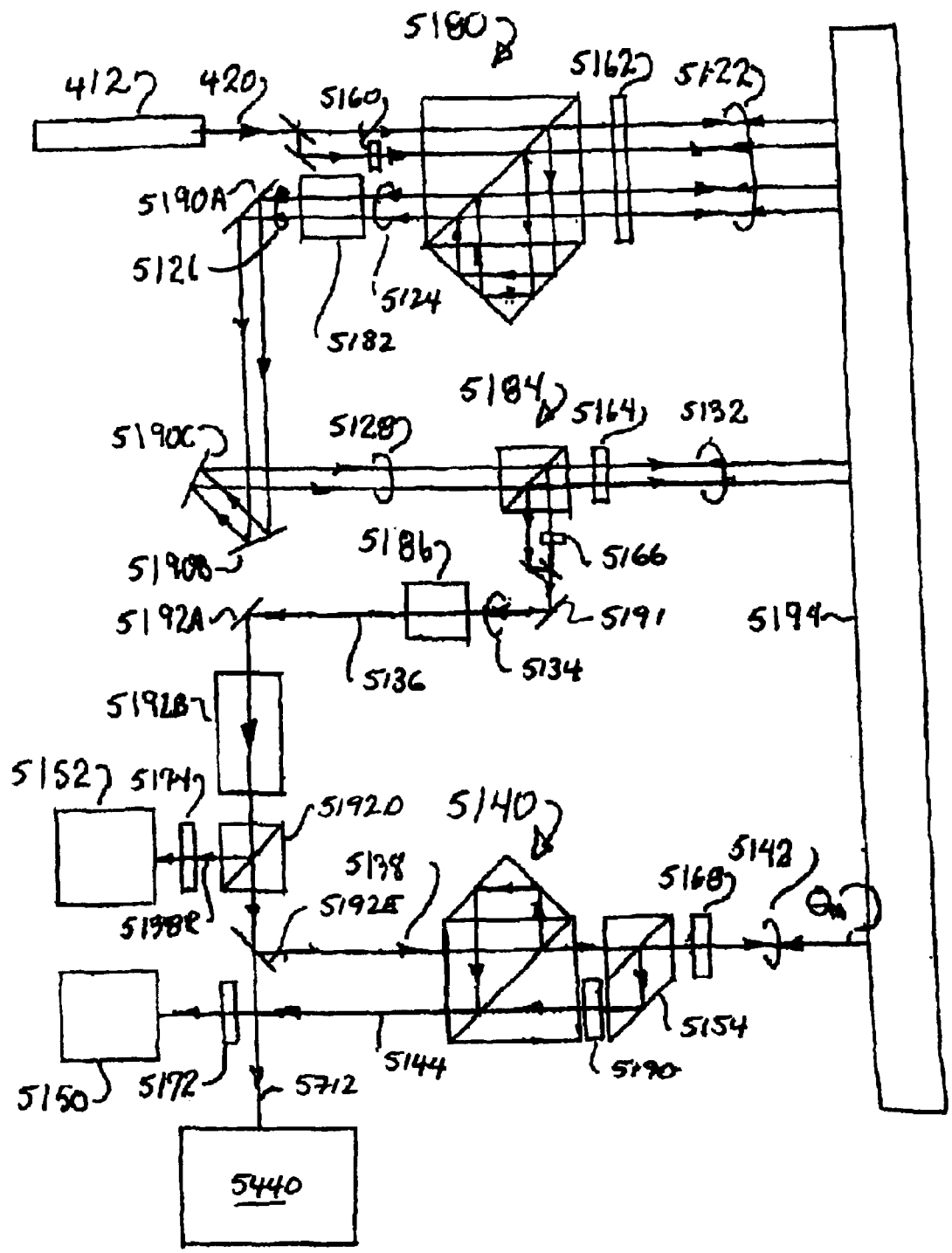
FIG. 5 is a schematic diagram of an SMBI passive interferometry system.

An embodiment of a passive SMBI is shown diagrammatically in FIG. 5. In this embodiment, the beam conditioner includes a differential plane mirror interferometer shown generally at 5180 wherein plane mirror 5194 serves as both the reference and measuring objects. The beam conditioner further includes a single pass plane mirror interferometer generally shown at 5184 wherein the reference and measurement objects are also plane mirror 5194. The remaining components of the beam conditioner are afocal systems 5182 and 5186 and beam relay system comprising elements 5190A, 5190B, and 5190C.

The description of source 412 and input beam 420 in the present embodiment is the same as the description given for the corresponding elements shown in FIG. 4. Input beam 420 is incident on interferometer 5180 to form beam 5122 and output beam 5124. Beam 5122 comprises both reference and measurement beams that each makes a double pass to mirror 5194. Elements 5160 and 5162 are half wave and quarter wave phase retardation plates, respectively.

Output beam 5124 comprises spatially separated reference and measurement output beam components. Output beam 5124 is transmitted by afocal 5182 to form demagnified beam 126. Directions of propagation of components of output beam 5124 and demagnified beam 5126 relative to the direction of propagation of input beam 420 are independent of any change in orientation of mirror 5194. This is a direct consequence of the double pass of both the reference and measurement beams to mirror 5194. However, there are lateral shears of the components of output beam 5124 and demagnified beam 5126 that result from a change in orientation of mirror 5194. The magnitudes $S_1$ and $S_2$ of the lateral shear vectors representing the shears of beam 5124 and beam 5126, respectively, are $$S_1 = 4\alpha L,$$

$$S_2 = \eta_1 4\alpha L \tag{1}$$

where $\alpha$ is the change in angular orientation of mirror 5194 from an orientation at which beam 5122 is normally incident on mirror 5194, $\eta_1$ is the demagnification factor describing the demagnification introduced by afocal system 5182, and L is a physical path length associated with beam 5122. The magnitude of length L is nominally the distance between the reflecting surface of mirror 5194 and the nodal point of the retroreflector in interferometer 5180 measured in a direction parallel to the direction of propagation of input beam 420. The change in angular orientation of mirror 5194 comprises the net effect of changes in pitch and yaw. The directions of the lateral shear vectors are in the plane of FIG. 5 for a change in yaw and perpendicular to the plane of FIG. 5 for a change in pitch.

Demagnified beam 5126 is incident on beam relay system comprising elements 5190A, 5190B, and 5190C and exits as beam 5128. The reflecting properties of the beam relay system are equivalent to those of a single reflecting surface such that the direction of propagation of beam 5128 is parallel to the direction of propagation of beam 5124. In addition, the lateral shear of beam 5128 resulting from a change in orientation of mirror 5194 is the same as the corresponding lateral shear of beam 5126.

Beam 5128 is incident on a single pass interferometer generally shown at 5184 in FIG. 5. The reflecting surface of mirror 5194 serves as the reference and measurement objects for interferometer 5184. Beam 5132 comprises both reference and measurement beams that contact mirror 5194 and output beam 5134 is the output beam of interferometer 5184.

Output beam 5134 is transmitted by afocal system 5186 as magnified beam 5136. Changes in directions of propagation of components of output beam 5134 and magnified beam 5136 are $2\alpha$ and $2\alpha/\eta_2$, respectively, with respect to the direction of propagation of beam 5128 where $\eta_2$ is the magnification factor of afocal system 5186. For the value of $\eta_2=2$, the direction of propagation of magnified beam 5136 relative to a vector orthogonal to the reflecting surface of mirror 5194 is independent of any change in orientation of mirror 5194. The magnitudes of the lateral shear vectors $S_3$ and $S_4$ representing the shears of beam 5134 and beam 5136, respectively, are $$S_3=(4\eta_1-2)\alpha L,$$

$$S_4=\eta_2(4\eta_1-2)\alpha L. \quad (2)$$

Because of the factor $(4\eta_1-2)$ in Eqs. (2), the magnitudes of lateral shears $S_3$ and $S_4$ are zero for the demagnification factor $$\eta_1=0.5. \quad (3)$$

Thus for $\eta_1=0.5$, there are substantially no lateral shears of the components of output beam 5134 and magnified beam 5136 that result from a change in orientation of mirror 5194.

Next as shown in FIG. 5, magnified beam 5136 is incident on a second relay optical system comprising mirror 5192A, beam splitter 5192C and image inverter 5192B. Non-polarizing beam splitter 5192D does not alter the properties of the second relay optical system with respect to the relative directions of propagation of beams 5136 and 5138. The properties of the second relay optical system are the same as a polarization preserving retroreflector with regard to properties of the transmitted beam 5138 relative to properties of incident beam 5136. A polarization preserving retroreflector is the preferred form of retroreflector in order to eliminate a potential source of polarization mixing. Polarization preserving retroreflectors are described in U.S. Pat. No. 6,198,574 B1 by Henry Allen Hill entitled "POLARIZATION PRESERVING OPTICAL SYSTEMS." Polarization mixing generally will generate cyclic errors in changes in displacement of mirror 5194 as measured by interferometer 5140.

Image inverter 5192B inverts the wavefront of beam 5136 upon being transmitted by inverter 5192B wherein the axis of the inversion is a line in the plane of FIG. 5 and that is perpendicular to the propagation direction of the beam. The function of image inverter 5192B in the second relay system is to cause for a beam transmitted by inverter 5192B a change in beam propagation direction in a plane that is opposite to the corresponding change in beam propagation direction in the plane of the corresponding beam incident on inverter 5192B. Image inverters are further described in U.S. patent application Ser. No. 10/207,314, entitled "PASSIVE ZERO SHEAR INTERFEROMETERS," by Henry A. Hill, filed Jul. 29, 2002, and published as U.S. Patent Publication No. US-2003-0053073-A1, which claims priority to Provisional Patent Application 60/309,608 by Henry A. Hill entitled "PASSIVE ZERO SHEAR INTERFEROMETERS" and filed Aug. 2, 2001.

Beam 5138 is incident of interferometer generally indicated at 5140 in FIG. 5 and is transmitted as output beam 5144. Interferometer 5140 is a single pass interferometer wherein the measurement beam 5142 makes a single pass to mirror 5194. Elements 5168 and 5170 are quarter wave and half wave phase retardation plates, respectively, and element 5154 comprises a polarizing beam splitter and a rhomb. Since a change in the angle of incidence of beam 5138 on interferometer 5140 is $\alpha$, the direction of propagation of beam 5142 relative to a vector orthogonal to reflecting surface of mirror 5194 is independent of changes of orientation of mirror 5194. In addition, the direction of propagation of beam 5142 may be aligned parallel to the vector, i.e., the angle of incidence $\theta_M$ (see FIG. 5) of beam 5142 on the reflecting surface of mirror 5194 is 90 degrees, by an adjustment of, for example, the orientations of mirrors, such as mirror 5192C, so that the direction of propagation of beam 5142 is orthogonal to the reflecting surface of mirror 5194 independent of changes of orientation of mirror 5194. Since both the beam shear of beam 5138 at interferometer 5140 is substantially zero and the direction of propagation of beam 5142 is always orthogonal to reflecting surface of mirror 5194 independent of changes of orientation of mirror 5194 for at least a range of angles, there is substantially no beam shear of output beam 5144 associated with changes in orientation of mirror 5194.

Beam shear of beams in an interferometer can generate non-cyclic non-linear errors in interferometrically measured changes in displacement of a measurement object. As a consequence of the substantially no beam shear of output beam 5144 associated with changes in orientation of mirror 5194, corresponding non-cyclic non-linear errors are substantially eliminated in displacements of minor 5194 measured by interferometer 5140.

Output beam 5144 is next transmitted by polarizer 5172 to generate a mixed output beam and then detected by detector 5150 to produce an electrical interference signal or heterodyne signal. Detector 5150 is preferably a quantum photon detector. The phase of the heterodyne signal is subsequently determined by a phase meter using a reference signal from source 412 (not shown in FIG. 5). Changes in displacement of mirror 5194 is inferred from the changes in the measured phase.

The relative phase of the reference and measurement beam components of beam 5138 can exhibit changes due for example to turbulence in non-coextensive optical paths of progenitor beam components of beam 5138 and to wavefront errors and beam shears generated by changes in orientation of mirror 5194. These changes in phase, if not compensated, may be large enough for certain end use applications to produce unacceptable errors in measured changes in the relative phase of output beam 5144. The errors that result from the changes in phase can be compensated by splitting off part of beam 5136 transmitted by image inverter 5192B as phase reference beam 5138R by non-polarizing beam splitter 5192D. Beam 5138R is next transmitted by polarizer 5174 to generate a mixed phase reference beam and then detected by detector 5152 to produce a reference electrical interference signal or reference heterodyne signal. Detector 5152 is preferably a quantum photon detector. The phase of the reference heterodyne signal is subsequently determined by a phase meter (not shown in FIG. 5) using the reference signal from source 412 (not shown in FIG. 5). The measured phase of the reference heterodyne signal is used to compensate for cited errors in measured phase of the heterodyne signal associated with output beam 5144.

Afocal systems 5182 and 5186 may comprise afocal lenses and/or anamorphic afocal attachments [see, e.g., Chapter 2 entitled "Afocal Systems" by W. B. Wetherell in *Handbook Of Optics II*, Second Edition (McGraw-Hill)]. A first embodiment is shown diagrammatically for an afocal system such as represented by a Galilean afocal lens. However, a Keplerian afocal lens can be used. If a Keplerian afocal lens is used for one or more afocal systems, the transformation properties of corresponding relay lens systems must be changed to reflect the inverting features of the Keplerian afocal lens. The afocal systems may also comprise anamorphic afocal attachments based on cyclindrical lenses, prisms, and birefringent elements.

Interferometers 5180 and 5184 are shown diagrammatically in FIG. 5 with the beam components of beam 5122 and of beam 5132 lying in the same plane to simplify the description of the operation of the present invention. The configuration of the first embodiment as shown in FIG. 5 also has an advantage with respect to the minimum width required for the reflecting surface of mirror 5194 in the dimension perpendicular to the plane of FIG. 5. It will be evident to those skilled in the art that other configurations of interferometers 5180 and 5184 may be used wherein the beam components of beam 5122 and of beam 5132 comprise two or more planes parallel to the plane of FIG. 5 without departing from the spirit and scope of the present invention.

In addition to measuring a displacement of mirror 5194 at one spot on the reflecting surface of mirror 5194, the present embodiment also measures the change in orientation of mirror 5194 in a plane by measuring a corresponding change in a direction of propagation of a beam that is orthogonal to the surface of mirror 5194 independent of changes in orientation of mirror 5194, for at least a range of orientation angles. The displacements measured by the single pass interferometer and the angle displacement interferometer are used to monitor linear displacements of mirror 5194 and a change in angular orientation of mirror 5194 in a first plane.

The angle displacement interferometer is generally shown at 5440 in FIG. 5. Beam splitter 5192E directs beam 5138 toward interferometer 5140 and transmits beam 5712 to angle interferometer 5440. The polarization of beam 5712 is the same as the polarization of beam 5138. In alternative embodiments, beam 5712 can be derived from output beam 5144 or from measurement beam 5142. In some embodiments, angle displacement interferometer 5440 can be replaced by a differential angle displacement interferometer. Additional angle displacement interferometers and/or differential angle displacement interferometers can be included with angle displacement interferometer 5440 to monitor a change in angular orientation of mirror 5194 in a second plane, orthogonal to the first plane. Exemplary embodiments of angle displacement interferometers and differential angle displacement interferometers are described below.

Further embodiments of passive interferometry systems are disclosed in the following applications: aforementioned Provisional Patent Application 60/309,608 by Henry A. Hill entitled "PASSIVE ZERO SHEAR INTERFEROMETERS," filed Aug. 2, 2001 and aforementioned U.S. patent application Ser. No. 10/207,314, similarly entitled "PASSIVE ZERO SHEAR INTERFEROMETERS," by Henry A. Hill, filed Jul. 29, 2002 and published as U.S. Patent Publication No. US-2003-0053073-A1; and Provisional Patent Application 60/314,345 by Henry A. Hill entitled "PASSIVE ZERO SHEAR INTERFEROMETERS USING ANGLE SENSITIVE BEAM-SPLITTERS" and filed Aug. 23, 2001.

We have described an embodiment of a passive SMBI, however, in some embodiments, SBMI's 210 and 212 can be dynamic interferometry systems. In such embodiments, the SMBI's includes a dynamic beam steering element that is servo-ed to the orientation of mirrors 260 and/or 272 to cause the measurement beam to contact the mirror at normal incidence.

A dynamic SMBI is shown schematically in FIGS. 6A and 6B comprising an interferometer system and a dynamic beam-steering assembly for a linear displacement and an orientation measurement of an object, e.g., a stage mirror. The interferometer system comprises a linear displacement interferometer and two angle measuring interferometers with the beam-steering assembly redirecting the measurement beams of the linear and angular displacement interferometers. The two angle measuring interferometers can be differential angle displacement interferometers or angle displacement interferometers.

The interferometer system measures a change in a distance to a position on the surface of the object and a change in orientation of the object about the same position. The detected change in orientation is in a plane defined by the properties of the angular displacement interferometers.

A source (not shown) directs an input beam 6610 to a polarizing beam splitter 6650. Input beam 6610 includes orthogonally polarized components that are frequency-shifted with respect one another, e.g., by Zeeman splitting, acousto-optic modulation, or by use of birefringent elements internal to the laser, prior to entering the interferometer. The different frequencies enable the interferometry system to generate a heterodyne interference signal.

The specific device used for the source of beam 6610 will determine the diameter and divergence of beam 6610. For some sources, e.g., a diode laser, it will likely be necessary to use conventional beam shaping optics, e.g., a conventional microscope objective, to provide beam 6610 with a suitable diameter and divergence for elements that follow. When the source is a HeNe laser, for example, beam-shaping optics may not be required.

Polarizing beam splitter 6650 splits input beam 6610 into measurement beam 6611 and reference beam 6612. Reference beam 6612 is linearly polarized perpendicular to the plane of FIG. 6A. A prism 6670 reflects reference beam 6612 towards detector 6680. Quarter waveplates 6668A and 6668B cause a rotation of the state of polarization of the reference beam, so that beam 6616 is linearly polarized in the plane of FIG. 6A.

Measurement beam 6611 is transmitted by polarizing beam splitter 6650. Measurement beam 6611 is linearly polarized in the plane of FIG. 6A. Beams 6613, 6615, 6621, 6629, 6631, 6633, and 6635 represent the measurement beam in different segments of interferometry system 6600. Beam 6611 is reflected by a first surface of beam steering mirror 6652 as beam 6613. Beam steering mirror 6652 and orientation transducers 6653A and 6653B comprise a beam steering assembly that redirects beam 6613. Transducers 6653A and 6653B are coupled to beam-steering mirror 6652 by flexures to orient beam-steering mirror 6652 in response to a servo control signal 6644H from a servo controller 6676H. The beam-steering assembly includes capacitance gauges, interferometers or the like to measure changes in orientation and/or position of beam-steering mirror 6652. The capacitance gauges or interferometers may also be used to measure and/or monitor the properties of piezoelectric transducers 6653A and 6653B.

Beam 6613 is reflected by mirror 6654 and enters mirror assembly 6656 as beam 6615. As shown in FIG. 6B, mirror assembly 6656 is comprised of three mirrors 6656A, 6656B, and 6656C. The plane of FIG. 6B is orthogonal to the plane of FIG. 6A. Beam 6615 is reflected by each of the three mirrors 6656A, 6656B, and 6656C and exits mirror assembly 6656 as beam 6621. Mirror assembly 6656 is an image inverter about an axis in the plane of FIG. 6A and orthogonal to the direction of propagation of beam 6615. However, the primary function of mirror assembly 6656 is to transform a change in the direction of propagation of beam 6615 in the plane of FIG. 6B to a change in the opposite direction of propagation of beam 6621 in the plane of FIG. 6B and to translate a change in direction of beam 6615 in the plane of FIG. 6A to the same change in direction of propagation of beam 6621 in the plane of FIG. 6A.

Beam 6621, being polarized in the plane of FIG. 6A, is transmitted by polarizing beam splitter 6658 as beam 6623. Beam 6623, polarized in the plane of FIG. 6A, is transmitted by a quarter wave phase retardation plate 6660 as a circularly polarized beam, reflected by measurement object mirror 6662 as a beam with opposite-handed circular polarization, and subsequently transmitted by quarter wave phase retardation plate 6660 as beam 6627 linearly polarized perpendicular to the plane of FIG. 6A. Beam 6627 is reflected by beam splitter 6658 as beam 6629.

Measurement beam 6631 is reflected by beam-steering mirror 6652 as measurement beam 6633. A first portion of measurement beam 6633 is reflected by non-polarizing beam splitter 6659A as a first measurement beam 6635. First measurement beam 6635 is reflected by polarizing beam splitter 6672 as a measurement beam component of first output beam 6640.

A second portion of measurement beam 6633 is transmitted by non-polarizing beam splitter 6659A and then reflected by mirror 6659B as a measurement beam 6634. Measurement beam 6634 is reflected by mirror 6673A as a second output beam 6641H.

A first portion of measurement beam 6613 is transmitted by non-polarizing beam splitter 6654A as a third output beam 6614H. A second portion of beam 6613 is reflected by non-polarizing beam splitter 6654A as measurement beam 6615.

A portion of reference beam 6616, as shown in FIG. 6A, is transmitted by polarizing beam splitter 6672 as a reference beam component of first output beam 6640. Output beam 6640 is transmitter by analyzer 6678 as mixed output beam 6642, the polarization states of the reference beam component and the measurement beam component of the mixed output beam 6642 being the same.

Interferometer system 6600 and measurement object mirror 6662 introduces phase shift $\phi_{10}$ between the measurement and reference beam components of mixed output beam 6642. Detector 6680 measures the intensity of mixed output beam 6642, e.g., preferably by photoelectric detection, to produce electrical interference signal or heterodyne signal $s_{10}$. Heterodyne signal $s_{10}$ is transmitted to electronic processor and computer 6682H as signal 6646, in either digital or analog format, preferably in digital format. Phase $\phi_{10}$ is analyzed to calculate changes in distance to measurement object mirror 6662.

Second output beam 6641H is incident on angle displacement interferometer 6681H1. Angle displacement interferometer 6681H1 generates electrical error signal $s_{11A}$, preferably in a digital format, that is transmitted to electronic processor and computer 6682H as signal 6647H1.

Third output beam 6614H is incident on angle displacement interferometer 6681H2. Angle displacement interferometer 6681H2 generates signal $s_{11B}$, preferably in a digital format, that is transmitted to electronic processor and computer 6682H as signal 6647H2. Angle displacement interferometers 6681H1 and 6681H2 are configured to monitor angle about orthogonal axes. The change in orientation of measurement object mirror 6662 in the plane of FIG. 6A is determined by electronic processor and computer 6682H as twice the net change in angles indicated by error signal 6647H1 and signal 6647H2 minus the effects of spatial gradients in the index of refraction of the gas in the measurement path. The effects of spatial gradients in the index of refraction of the gas in the measurement path are equal to the integration of $(\partial n_M/\partial s)$ along the optical path of the measurement beam comprising the gas where $(\partial n_M/\partial s)$ is the partial derivative of the refractive index of the optical path comprising the gas at a respective point along the measurement path with respect to a vector orthogonal to the optical path of the measurement beam and parallel to the plane of FIG. 6A.

Signal processor and computer 6682H transmits an error signal to servo controller 6676H, based on the measured error signal $S_{11A}$, and server controller 6676H sends servo control signal 6644H to transducers 6653A and 6653B. Alternatively, in other embodiments, the angle measurement system includes calibration data for beam-steering mirror 6652 that correlates the servo control signal 6644H to transducers 6653A and 6653B with a corresponding change in angular orientation of the beam-steering mirror 6652, which is directly related to the change in angular orientation of measurement object mirror 6662.

Other embodiments of dynamic interferometry systems are described in U.S. Pat. No. 6,252,667, entitled "INTERFEROMETER HAVING A DYNAMIC BEAM STEERING ASSEMBLY," by Henry A. Hill, et al., issued Jun. 26, 2001; U.S. patent application Ser. No. 09/968,887, entitled "SINGLE-PASS AND MULTI-PASS INTERFEROMETRY SYSTEMS HAVING A DYNAMIC BEAM-STEERING ASSEMBLY FOR MEASURING DISTANCE, ANGLE, AND DISPERSION," by Henry A. Hill et al., filed Oct. 2, 2001; PCT Patent Application published under International Publication Number WO 00/66969, entitled "INTERFEROMETRY SYSTEM HAVING DYNAMIC BEAM-STEERING-ASSEMBLY FOR MEASURING ANGLE AND DISTANCE," by Henry A. Hill, filed May 5, 2000; U.S. patent application Ser. No. 09/384,851, entitled "INTERFEROMETRY SYSTEM HAVING A DYNAMIC BEAM STEERING ASSEMBLY FOR MEASURING ANGLE AND DISTANCE," to Henry A. Hill, filed Aug. 27, 1999; and U.S. patent application Ser. No. 10/226,591, entitled "DYNAMIC INTERFEROMETER CONTROLLING DIRECTION OF INPUT BEAM," by Henry A. Hill, filed Aug. 23, 2002 and published as U.S. Patent Application Publication No. US-2003-0043384-A1.

We now describe embodiments of differential angle displacement interferometers and angle displacement interferometers for use in passive and dynamic SMBI's. A differential angle displacement interferometer 710 is shown schematically in FIG. 7A. Input beam 712 comprises two orthogonally polarized components having a difference in frequencies of $f_1$. Input beam 712 corresponds to, e.g., a beam derived from output beam 444, as shown in FIG. 4. The planes of polarization of the two orthogonally polarized components are at angles of 45° to the plane of FIG. 7A. The directions of propagation of the two components of input beam 712 may be the same or different one from the other. Input beam 712 impinges on an etalon generally indicated by element number 730 with a gap d. The angles of incidence of the first and second components of input beam 712 at the interior faces of etalon 730 are $\theta_{o,1}$ and $\theta_{o,2}$, respectively. Angles $\theta_{o,1}$ and $\theta_{o,2}$ are selected so that the transmission of the first and second components of input beam 712 by etalon 730 are each substantially at a maximum excluding the maximum in transmission possible at $\theta_{o,j}=0$ for j=1, 2. For the first embodiment, the difference angle $(\theta_{o,2}-\theta_{o,1})$<<than the angular width of the corresponding transmission peak.

The first and second components of input 712 are transmitted as first and second orthogonally polarized beam components of output beam 722. Output beam 722 is transmitted by polarizer 736 to form mixed beam 726. Mixed beam 726 is focused by lens 746 to an image spot on detector 758. The beam forming the image spot is detected, preferably by photoelectric detection, by detector 758 as electrical interference signal 728.

Signal 728 is a heterodyne signal having a heterodyne frequency equal to $f_1$, the difference in frequencies of the first and second components of input beam 712, and a heterodyne phase $\phi_{1,2}$. Heterodyne phase $\phi_{1,2}$ corresponds to, e.g., phase $\phi_2$ in the first embodiment and to phase $\phi_{20}$ in the second embodiment. Signal 728 is processed by, a suitable electronic processor, such as computer 729.

Figure 7A:
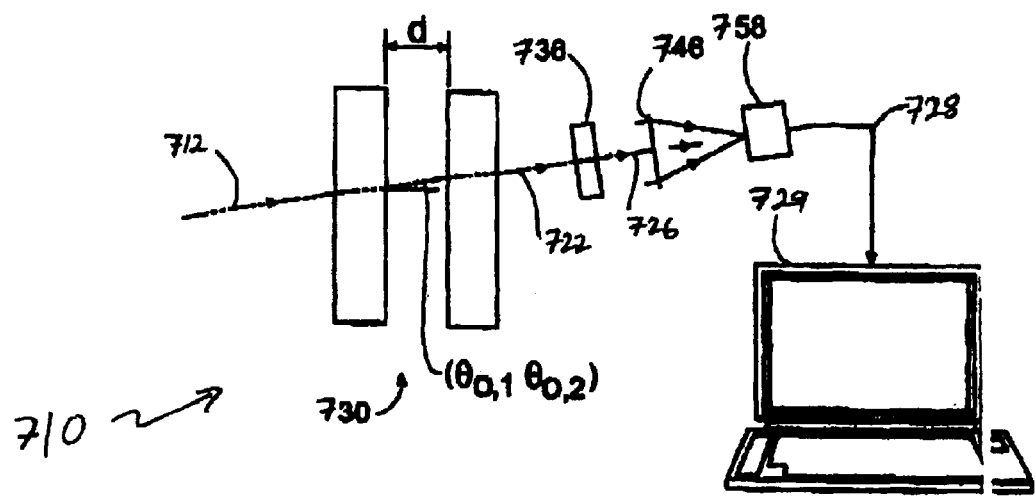
FIGS. 7A–7B are schematic diagrams of a differential angle displacement interferometer.

For a non-limiting example of a non-apodized square aperture at lens 746, the intensity profile $I_{h,1}$, at the image spot in the plane of FIG. 7A for components of beam 726 responsible for heterodyne signal 728, is written to a good approximation as $$I_{h,1} = \frac{C_{h,1}(1-R_1)^2}{[(1-R_1)^2 + 4R\sin^2(\delta'_{1,2}/2)]} \times \mathrm{sinc}^2[kp_{1,2}(b/2)]\cos[\omega_1 t + (\phi_2 - \phi_1)] \quad (4)$$

where $$\delta'_j = 2knd(p_j \tan \theta_{o,j} + \cos \theta_{o,j}), j=1, 2, \quad (5)$$

$$p_j = \sin \theta_{o,j} + \sin \theta_{i,j}, j=1, 2, \quad (6)$$

$$\tan\phi_j = \frac{R_1 \sin\delta_j}{1 - R_1 \cos\delta_j}, j = 1, 2, \quad (7)$$

Figure 7B:
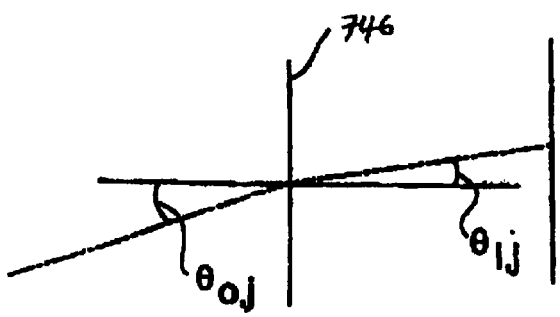

$\delta'_{1,2}=(\delta'_2+\delta'_1)/2$, $p_{1,2}=(p_2+p_1)/2$, b is the width of the square aperture at lens 746 in the plane of FIG. 7A, $C_{h,1}$ is a proportionality constant, $R_1$ is the intensity reflectivity of the interior surfaces of etalon 730, $\omega_1=2\pi f_1$, and k and n are, respectively, the wavenumber of the input beam components and the index of refraction of a medium in the gap of etalon 730. Angles $\theta_{o,1}$ and $\theta_{o,2}$ are defined according to FIG. 7B.

Heterodyne signal 728 is proportional to the integral of $I_{h,1}$ over the image spot. At a transmission peak, i.e. $\delta'_j \cong 2q_j\pi$ where $q_j$ is an integer typically>>1 and $\phi_j \cong 2q'_j\pi$ where $q'_j$ is an integer, sensitivity of heterodyne phase $\phi_{1,2}$ to changes in $\theta_{o,1}$ and $\theta_{o,2}$ may be expressed as $$d\varphi_{1,2} = -\frac{R_1}{(1-R_1)} 2knd \left[\sin\left(\frac{\theta_{o,2}+\theta_{o,1}}{2}\right)\right](d\theta_{o,2} - d\theta_{o,1}). \quad (8)$$

In order to reduce complexity in the display of general properties of the invention without departing from the scope or spirit of the invention, higher order terms in Eq. (8) have been omitted.

Heterodyne phase, $\phi_{1,2}=\phi_2-\phi_1$, may be obtained through the use of time based phase analysis procedures such as with a Hilbert transform or the like.

For an etalon spacing of d=4 mm, $R_1$=0.99, $\lambda$=633 nm, n=1.000, and $[(\theta_{o,2}+\theta_{o,1})/2]$=0.0129 rad, sensitivity of phase $\phi_{1,2}$ to changes in $\theta_{o,1}$ and $\theta_{o,2}$ is $$d\phi_{1,2} = -1.01 \times 10^5 (d\theta_{o,2} - d\theta_{o,1}). \quad (9)$$

Or expressed in terms of sensitivity of inferred values for $(d\theta_{o,2}-d\theta_{o,1})$ from measured changes in phase $\phi_{1,2}$, $$(d\theta_{o,2}-d\theta_{o,1}) = -0.99 \times 10^{-5} d\phi_{1,2}. \quad (10)$$

It is evident for the first embodiment that the measurement of a difference in angle $(d\theta_{o,2}-d\theta_{o,1})$ is based on an optical differencing technique wherein the measured phase difference between a first and second beam components is not sensitive in first order to effects of a frequency shift common to both the first and second beam components.

Improved accuracy in measurements of relative changes in directions of propagation of input beam components can be obtained by operating at a low frequency split between the first and second beam components. The option to use a low frequency split in certain end use applications is a direct consequence of the absence of first order input beam frequency shift effects in the phase of heterodyne signal 728 used to measure and monitor changes in relative directions of propagation of components of input beam 712.

The phase of the electrical interference signal used to measure and monitor changes in direction of propagation of the input beam may be determined using either a heterodyne technique as described or a homodyne technique when frequency $f_1 \cong 0$.

Differential angle displacement interferometer 710 can be used as a null detector without accurate knowledge of the coefficient of $d\phi_{1,2}$ in Equation (10). With the calibration of the coefficient of $d\phi_{1,2}$ in Equation (10), the first embodiment can be used to measure relative changes in the direction of propagation of the first and second components of input beam 712 that are less than the width of the corresponding transmission peak.

Figure 8:
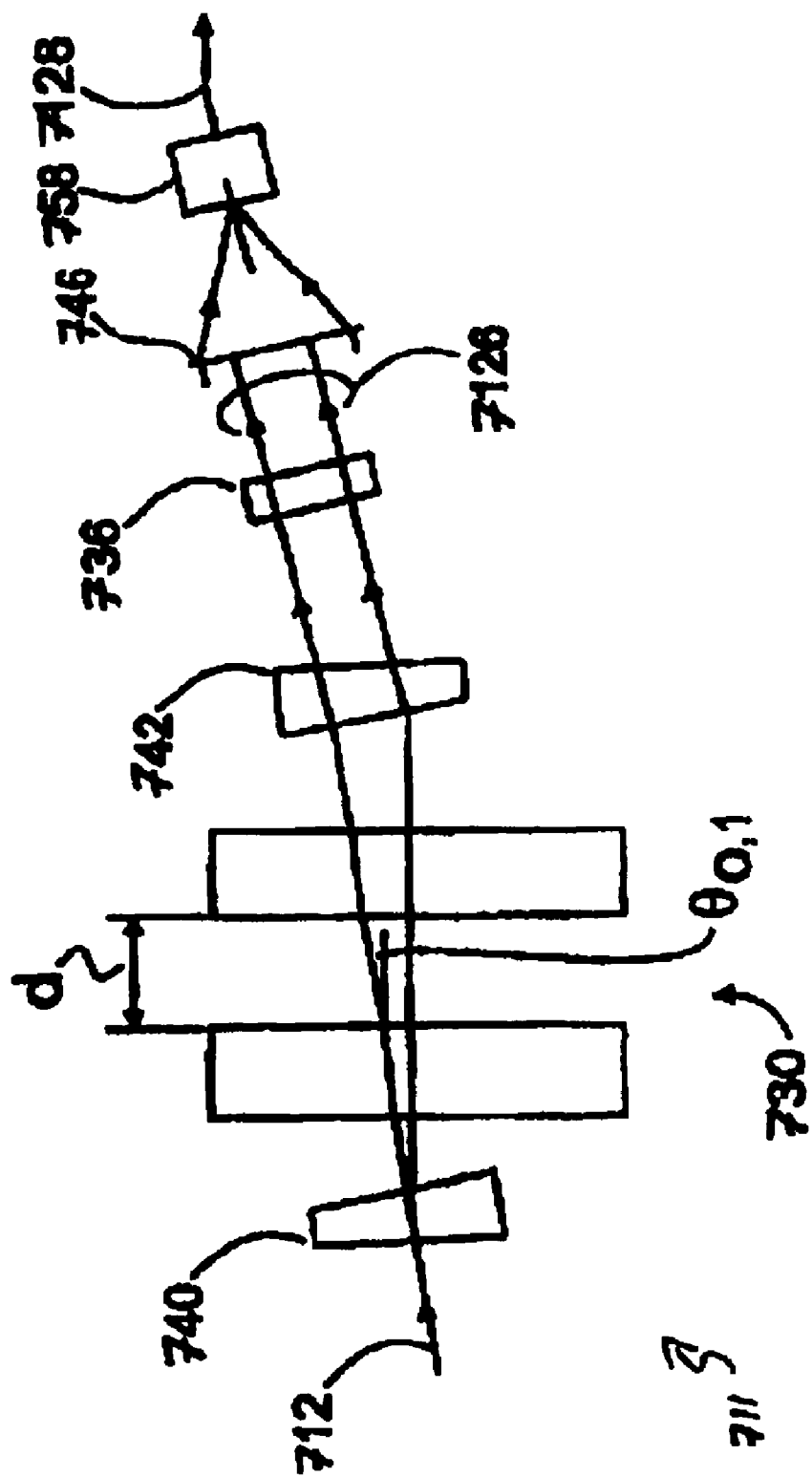
FIG. 8 is a schematic of an angle displacement interferometer.

Differential angle displacement interferometer 710 can be modified to provide angle displacement interferometer 711, shown schematically in FIG. 8. Apparatus of the second embodiment comprises the same components as the apparatus of the first embodiment and two birefringent prisms 740 and 742. Birefringent prism 740 introduces an angle between the first and second components of input beam 712 such that $\theta_{o,1}$ and $\theta_{o,2}$ correspond to two different transmission peaks of etalon 730. Birefringent prism 742 recombines beams out of etalon 730 so that first and second components of the output beam 7126 associated with the first and second components of input beam 712, respectively, have substantially parallel directions of propagation. For example, if $\theta_{o,2}=0$ for the second embodiment, then the sensitivity of phase $\phi_{1,2}$ to changes in $\theta_{o,1}$ is expressed by Equations (8) and (9) with $d\theta_{o,2}=0$. Likewise, sensitivity of inferred values for $d\theta_{o,1}$ from measured changes in phase $\phi_{1,2}$ is expressed by Equation (10) with $d\theta_{o,2}=0$.

Thus, with the calibration of the coefficient of in Equation 7, the second embodiment can be used to measure changes in the direction of propagation of the first component of the input beam 712 with respect to an orientation of the apparatus of the second embodiment. It will be evident to those skilled in the art that the second embodiment can equally well be been configured to measure changes in the direction of propagation of the second component of input beam 712.

The remaining description of angle displacement interferometer 711 is the same as corresponding portions of differential angle-measuring interferometer 710.

Figure 9A:
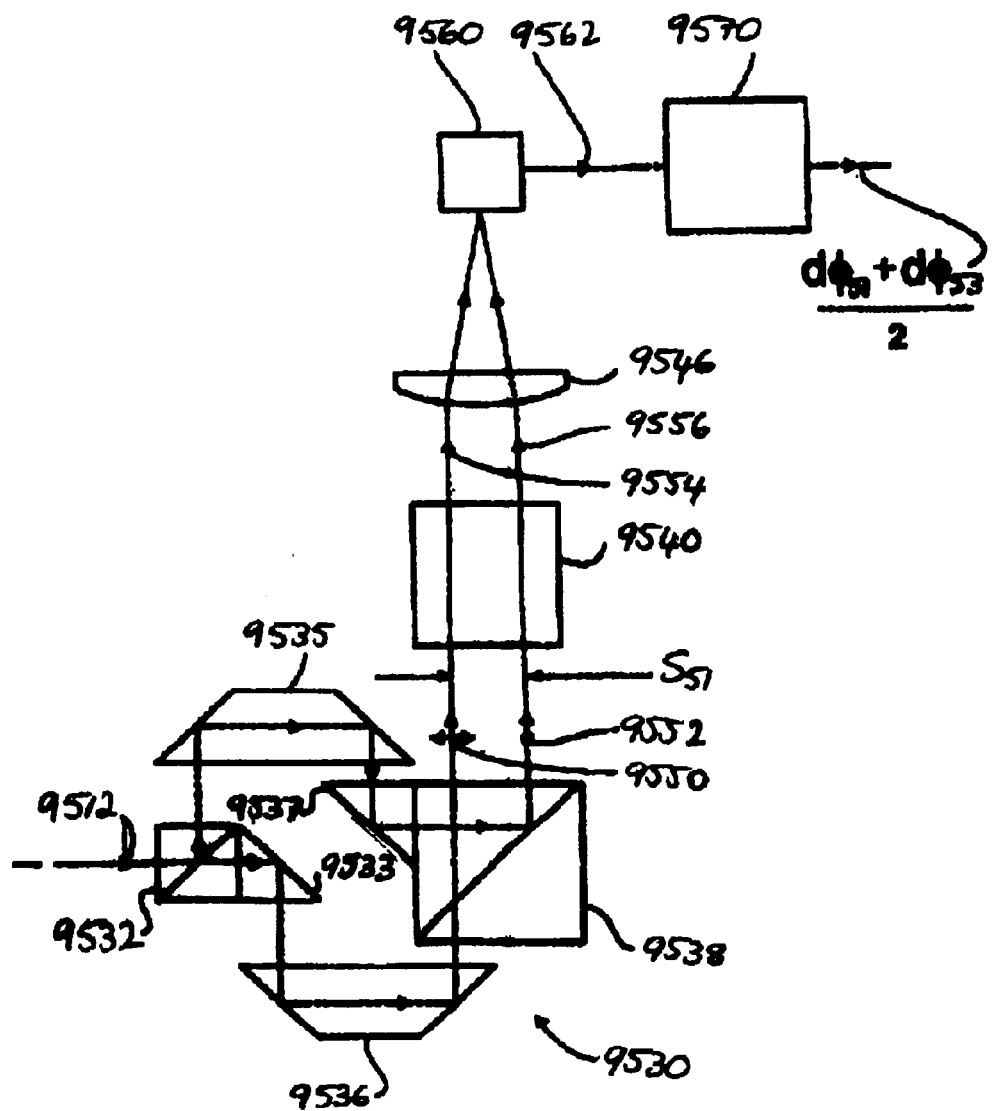
FIGS. 9A–9E are schematic diagrams of other embodiments of an angle displacement interferometer.

An alternative angle displacement interferometer 9500 is shown schematically in FIG. 9A and makes angle measurements in one plane of the average direction of propagation of an optical beam comprising two components. Angle-displacement interferometer 9500 comprises beam-shearing assembly generally shown at element numeral 9530, analyzer 9540, lens 9546, detector 9560, and electronic processor 9570. Input beam 9512 comprises two orthogonally polarized optical beam components having a difference in frequencies of $f_1$. The planes of polarization of the two orthogonally polarized components are parallel and orthogonal to the plane of FIG. 9A, respectively.

Beam-shearing assembly 9530 introduces a lateral shear $S_{51}$ between the two orthogonally polarized beams 9550 and 9552, respectively (see FIG. 9A). A portion of each of the spatially sheared output beams 9550 and 9552 are transmitted by analyzer 9540 as components 9554 and 9556, respectively. Analyzer 9540 is orientated so that beam components 9554 and 9556 are both polarized in a common plane orientated at 45 degrees to the plane of FIG. 9A.

Next, beam components 9554 and 9556 are incident on lens 9546 wherein lens 9546 focuses beam components 9554 and 9556 to spots on detector 9560 to be detected preferably by a quantum photon detector to generate electrical interference signal 9562 or heterodyne signal $s_{51}$. The spots substantially overlap. Heterodyne signal $s_{51}$ is transmitted to electronic processor 9570 for determination of the heterodyne phase of signal $s_{51}$ and a corresponding average direction of propagation of beam 9512 in the plane of FIG. 9A.

Beam-shearing assembly 9530 comprises polarizing beam-splitters 9532 and 9538, right angle prisms 9533 and 9537, and truncated Porro prisms 9535 and 9536. The component of beam 9512 polarized in the plane of FIG. 9A is transmitted by polarizing beam-splitter 9532, reflected by right angle prism 9533, redirected by truncated Porro prism 9536, and reflected by polarizing beam-splitter 9538 as beam 9550. The component of beam 9512 polarized orthogonal to the plane of FIG. 9A is reflected by polarizing beam-splitter 9532, redirected by truncated Porro prism 9535, reflected by right angle prism 9537, and transmitted by polarizing beam-splitter 9538 as beam 9552.

Note that the optical path in glass for each of beams 9554 and 9556 through beam-shearing assembly 9530 and analyzer 9540 are preferably the same. This feature of the apparatus design of angle displacement interferometer 9500 produces a high stability interferometer system with respect to changes in temperature.

Heterodyne signal $s_{51}$ may be written as $$s_{51} = A_{51} \cos(\omega_{51} t + \Phi_{51} + \zeta_{51}) \tag{11}$$

where $$\phi_{51} = 2k_{51} n [d_{51} \cos\theta'_{51} + d_{52} \cos\theta'_{52} - d_{53} \cos\theta'_{53} - d_{54} \cos\theta'_{54}], \tag{12}$$

Figure 9B:
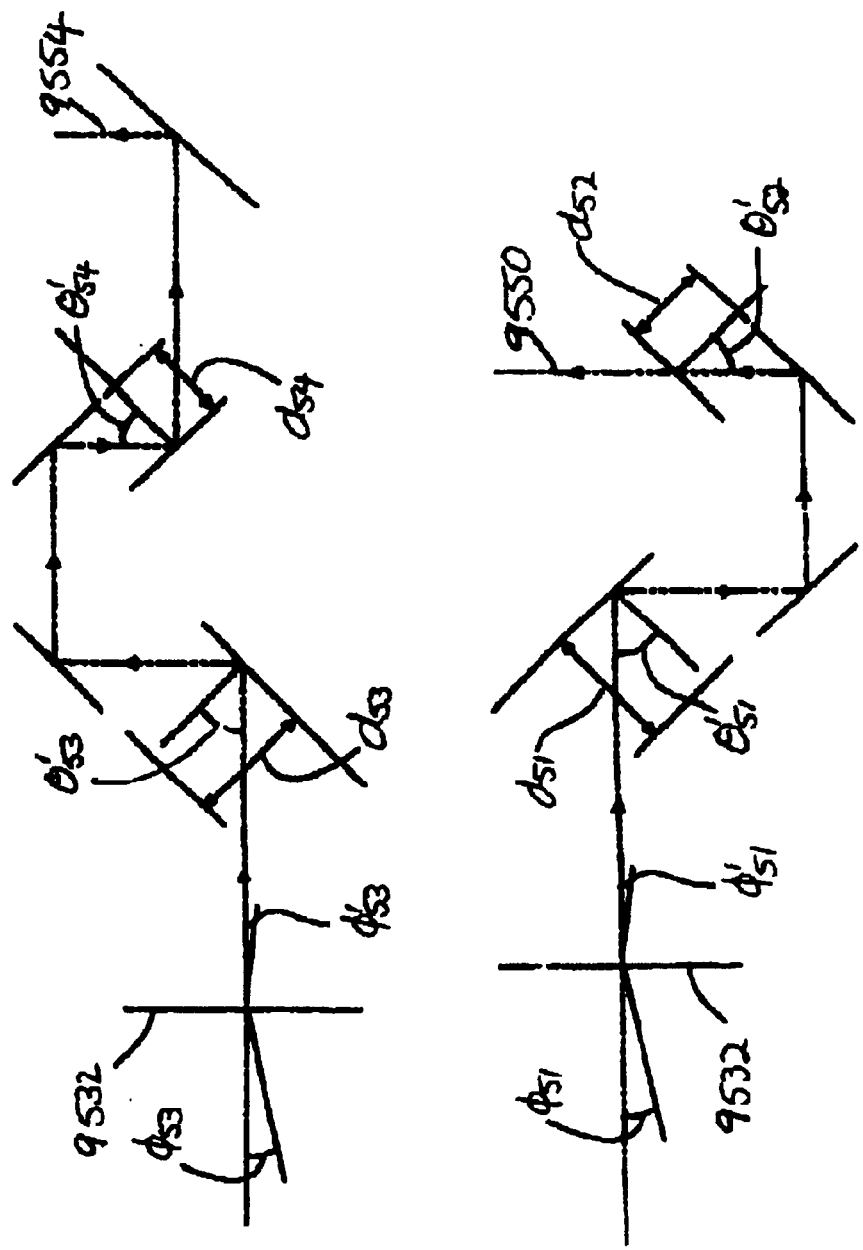

$\omega_{51} = 2\pi f_{51}$, $\zeta_1$ is an offset phase not associated with phase $\phi_{51}$, $k_{51} = 2\pi/\lambda_{51}$, $\lambda_{51}$ is the wave length of input beam 9512, $\theta'_{51}$ and $\theta'_{52}$ are angles of incidence of beam 9550 at right angle prism 9533 and at the polarizing beam-splitter 9538, respectively, (see FIG. 9B), $\theta'_{53}$ and $\theta'_{54}$ are angles of incidence of beam 9552 at polarizing beam-splitter 9532 and at right angle prism 9537, respectively, (see FIG. 9B), and $d_{51}$, $d_{52}$, $d_{53}$, and $d_{54}$ are defined in FIG. 9B. It has been assumed in Equation (12) for the purposes of demonstrating the features of the present invention in a simple fashion without departing from the scope and spirit of the present invention that all of the optical paths in beam-shearing assembly 9530 have the same index of refraction. For a non-limiting example of $d_{51}=d_{53}$, $d_{52}=d_{54}$, $\theta'_{51}+\theta'_{52}=\pi/2$, and $\theta'_{53}+\theta'_{54}=\pi/2$, Equation (12) reduces to the simpler expression for $\phi_{51}$, $$\varphi_{51} = 2^{1/2} k_{51} n \begin{bmatrix} (d_{51} - d_{52})[\cos(\theta'_{51} + \pi/4) + \cos(\theta'_{54} + \pi/4)] + \\ (d_{51} + d_{52})[\sin(\theta'_{51} + \pi/4) - \sin(\theta'_{54} + \pi/4)] \end{bmatrix}. \tag{13}$$

Lateral shear $S_{51}$ is related to properties of beam-shearing assembly 9530 according to the equation $$S_{51} = 2 \begin{bmatrix} (d_{51}\sin\theta'_{51} - d_{52}\sin\theta'_{52})\sec\phi'_{51}\cos\phi_{51} + \\ (d_{53}\sin\theta'_{53} - d_{54}\sin\theta'_{54})\sec\phi'_{53}\cos\phi_{53} \end{bmatrix} \tag{14}$$

where $\phi_{51}$ and $\phi'_{51}$ are the angles of incidence and refraction of beam 9550 at entrance facet of polarizing beam-splitter 9532 and $\phi_{53}$ and $\phi'_{53}$ are the angles of incidence and refraction of beam 9552 at entrance facet of polarizing beam-splitter 9532 (see FIG. 9B). For the non-limiting example, $$S_{51} = 2^{1/2} \left\{ (d_{51} - d_{52}) \begin{bmatrix} \sin(\theta'_{51} + \pi/2)\sec\phi'_{51}\cos\phi_{51} + \\ \sin(\theta'_{54} + \pi/2)\sec\phi'_{53}\cos\phi_{53} \end{bmatrix} + (d_{51} + d_{52}) \begin{bmatrix} \sin(\theta'_{51} - \pi/2)\sec\phi'_{51}\cos\phi_{51} - \\ \sin(\theta'_{54} - \pi/2)\sec\phi'_{53}\cos\phi_{53} \end{bmatrix} \right\}. \tag{15}$$

The expression given for $S_{51}$ by Equations (14) and (15) represent the primary mechanism used for generation of the beam shear. However, there are other mechanisms for introducing a beam shear such as associated with angle of incidence dependent phase shifts (Goos-Hänchen effect).

Figure 9C:
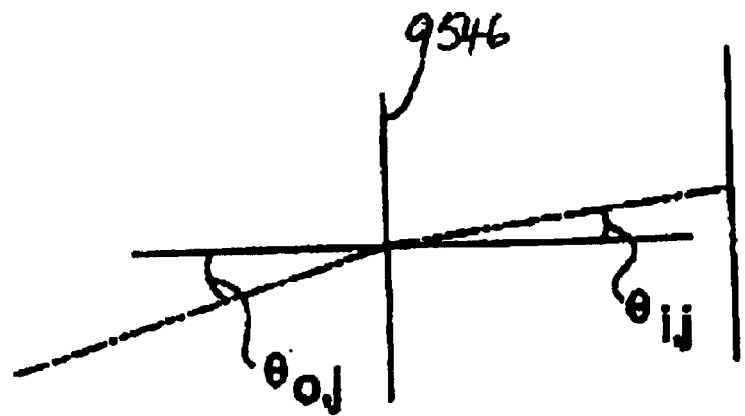
Figure 9D:
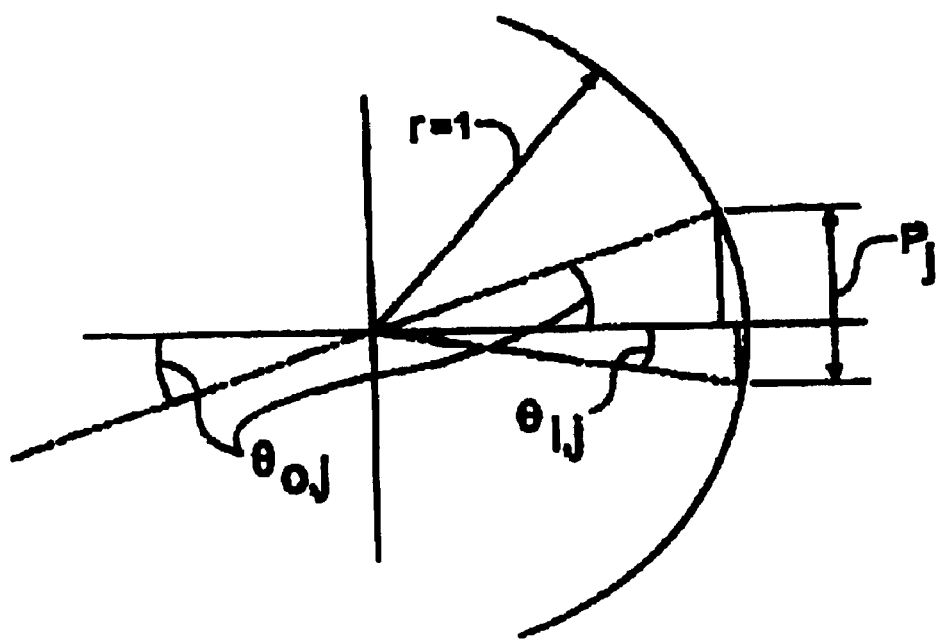

Amplitude $A_{51}$ is proportional to a good approximation to a Fourier component of the Fourier transform of $|h(p_{51})|^2$, i.e., $$A_{51} \propto \int |h(p_{51})|^2 \cos[4k_{51} p_{51} S_{51}] dp_{51} \tag{16}$$

where $h(p_{51})$ is the Fourier transform of the amplitude of one of the beams 9554 or 9556 at lens 9546 multiplied by the pupil function of lens 9546, $$p_j = \sin\theta_{o,j} + \sin\theta_{1,j}, \; j=51,52\ldots, \tag{17}$$

and the definition of $\theta_{o,j}$ and $\theta_{i,j}$ are shown in FIG. 9C. Angles $\theta_{o,j}$ and $\theta_{i,j}$ are conjugate angles of principle rays of beam $j$ in the object and image space of lens 9546. The definition of $p_j$ is shown in FIG. 9D.

It is evident from Equations (12) and (13) that the resolution of phase $\phi_{51}$ in terms of a change in a direction of an optical beam is increased as the length $2^{3/2}(d_{51}-d_{52})$ is increased. However, the usable range for $2^{3/2}(d_{51}-d_{52})$ is defined by the spatial frequency bandwidth of the Fourier transform of $|h(p_{51})|^2$ as shown by Equation. (16).

The optimum value for $2^{3/2}(d_{51}-d_{52})$ is generally equal to approximately one half a characteristic spatial dimension of a beam transmitted by a respective pupil. Consider, for example, the case of a rectangle pupil of dimension b in the plane of FIG. 9A for both beam 9554 and beam 9556 at lens 9546 and the amplitudes of beams 9554 and 9556 being uniform across respective pupils. For this case, $|h(p_{51})|^2$ is a sinc function squared, i.e. $(\sin x/x)^2$, and the Fourier transform of $|h(p_{51})|^2$ is a triangle function $\Lambda$. Triangle function $\Lambda$ has a maximum value of 1 for $2^{3/2}(d_{51}-d_{52})=0$ and has a value of 0 for $2^{3/2}(d_{51}-d_{52}) \geq b$. Therefore, amplitude $A_{51}=0$ for $2^{3/2}(d_{51}-d_{52}) \geq b$ and the resolution of phase $\phi_{51}$ in terms of a change in a direction of an optical beam is 0 for $2^{3/2}(d_{51}-d_{52})=0$. Thus the optimum value for $2^{3/2}(d_{51}-d_{52})$ is in this case approximately b/2. The actual optimum value for $2^{3/2}(d_{51}-d_{52})$ will depend on the criterion used to define an optimum operating condition with respect to a signal-to-noise ratio, for example. For the case where the components of beam 9512 have Gaussian intensity profiles, the optimum value for $2^{3/2}(d_{51}-d_{52})$ will be approximately w where w is the radius at which the intensity of beam 9512 has a value equal to 1/e of the intensity at beam 9512 at its center.

For an example of a beam having a Gaussian intensity profile with 2w=5.0 mm, $\theta_{51}$=45 degrees, and $\lambda_{51}$=633 nm, the sensitivity of the phase $\phi_{51}$ to changes in $d\phi_{51}$ and $d\phi_{53}$ expressed in differential form is given by the equation $$d\varphi_{51} = k_{51}w\left[\frac{d\phi_{51}+d\phi_{53}}{2}\right] \quad (18)$$

$$= -2.5 \times 10^4 \left[\frac{d\phi_{51}+d\phi_{53}}{2}\right].$$

Note, as evident from Equation (18) that the sensitivity of the change in phase $\phi_{51}$ with respect to changes in angles $d\phi_{51}$ and $d\phi_{53}$ is independent of the index of refraction n. This is an important property of the first embodiment. In particular, the sensitivity of the change in phase $\phi_{51}$ with respect to changes in angles $d\phi_{51}$ and $d\phi_{53}$ has a sensitivity to temperature changes that is independent in first order to thermal induced changes in the refractive index of the optical elements of beam-shearing assembly 9530 and only dependent on thermal coefficients of expansion of the optical elements of beam-shearing assembly 9530. The thermal coefficients of the elements of beam-shearing assembly 9530 can be selected to be less than $\leq 0.5$ ppm/° C. For similar reasons, the zero value of $\phi_{51}$ also exhibits a corresponding low sensitivity to changes in temperature of beam-shearing assembly 9530.

The two primary quantities that place restrictions on the range of average value $[d\phi_{51}+d\phi_{53}]/2$ that can be accommodated by the first embodiment are the magnitude of the difference $[d\phi_{51}-d\phi_{53}]/2$ and the size of the sensitive area of detector 9560. The amplitude of the heterodyne signal will be reduced by a factor of approximately 2 when $$wk_{51}\left[\frac{[d\phi_{51}-d\phi_{53}]}{2}\right] \approx 1.$$

The higher terms in $d\phi_{51}$ and $d\phi_{53}$ that are on Equation (18) can be easily determined from Eq. (12) if required for a particular end use application.

Figure 9E:
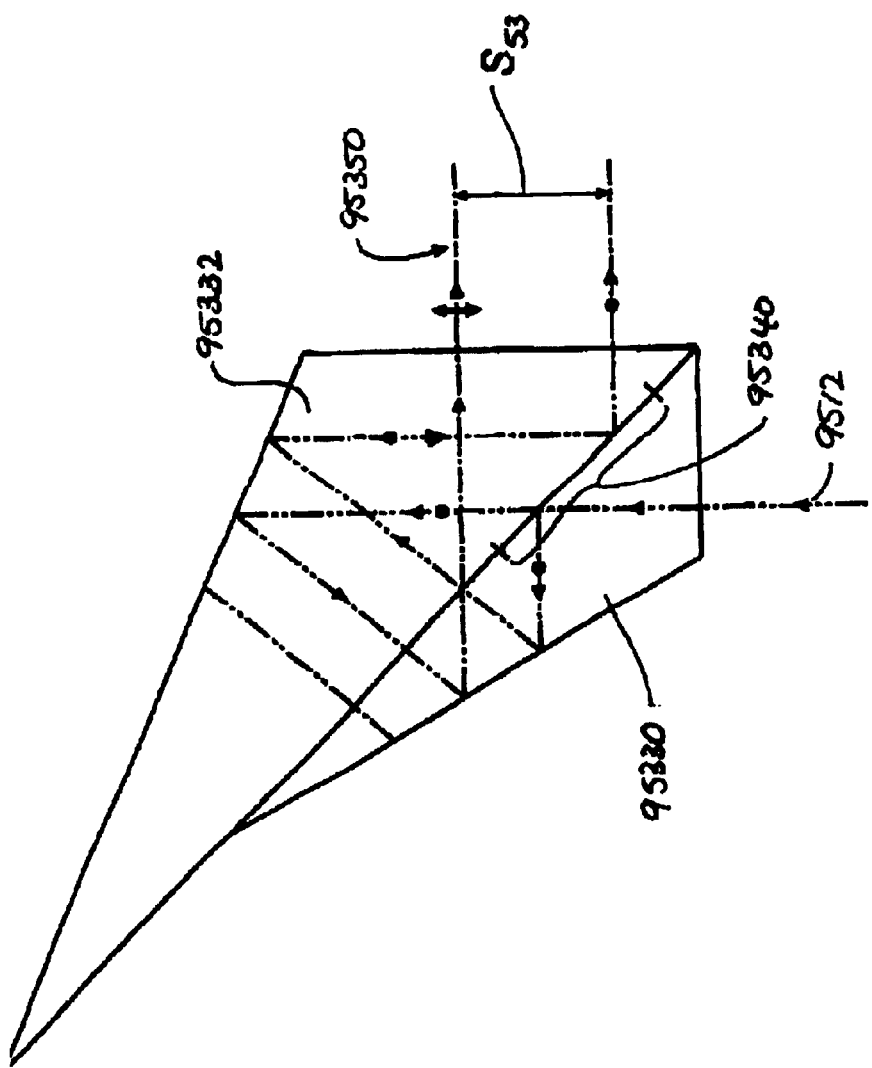

A second embodiment of beam-shearing assembly 9530 is shown diagrammatically in FIG. 9E and comprises two prisms 95330 and 95332 and polarization beam-splitter interface 95340. A first component of input beam 9512 is transmitted twice by polarization beam-splitter interface 95340 and reflected by facets of prisms 95330 and 95332 to form output beam 95350. A second component of input beam 9512 is reflected twice by polarization beam-splitter interface 95340 and reflected by facets of prisms 95330 and 95332 to form output beam 95352.

The two prisms 95330 and 95332 and polarization beam-splitter interface 95340 exhibit properties the same as a Penta prism with respect to relationship of the direction of propagation of beam 9512 and the directions of propagation for beams 95350 and 95352. Prisms 95330 and 95332 are preferably isomorphic with relative sizes selected to introduce a beam shear $S_{53}$ between beams 95350 and 95352. The optical paths in refractive media are substantially the same for beam 95350 and 95352. The remaining descriptions of beams 95350 and 95352 are the same as the corresponding portion of the descriptions given for beams 9550 and 9552 of the first embodiment with shear $S_{51}$ replaced by shear $S_{53}$. The description of input beam 9512 in FIG. 9E is the same as the description of input beam 9512 of the angle displacement interferometer shown in FIG. 9A.

Figure 10:
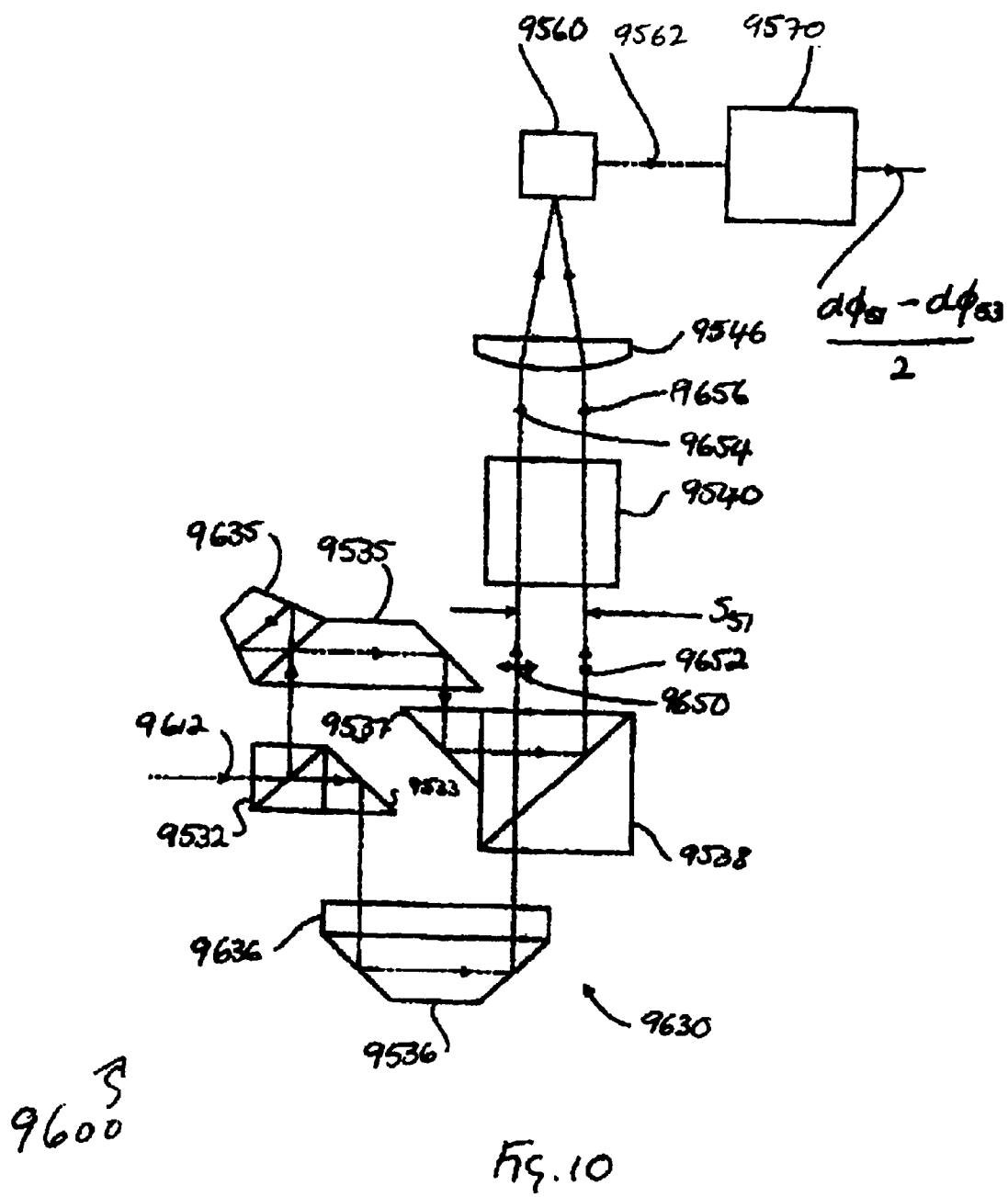
FIG. 10 is a schematic diagram of another embodiment of a differential angle displacement interferometer.

Another example of a differential angle displacement interferometer, labeled by reference numeral 9600, is shown schematically in FIG. 10 and makes angle measurements in one plane of the difference in direction of propagation of components of a two component optical beam. The differential angle displacement interferometer 9600 comprises beam-shearing assembly generally shown at element numeral 9630, analyzer 9540, lens 9546, detector 9560, and electronic processor 9570. The description of input beam 9612 is the same as the corresponding portion of the description given for input beam 9512, shown in FIG. 9A.

Beam-shearing assembly 9630 comprises many elements having the same the element number as elements of the beam-shearing assembly 9530 of the angle displacement interferometer 9500 performing like functions. Beam-shearing assembly 9630 further comprises Penta prism 9635 and compensating plate 9636. Penta prism 9635 introduces an additional reflection in the optical path of beam 9652 that results in an image inversion of beam 9652 about a normal to the plane of FIG. 10. Associated with the image inversion is a propagation direction transformation wherein a change in direction of propagation of the component of input beam 9612 reflected by polarizing beam-splitter 9532 is transformed into an opposite change in direction of propagation of beam 9652 in the plane of FIG. 10. The thickness of compensating plate 9636 is selected such that the optical path in glass for beams 9650 and 9652 in beam-shearing assembly 9630 are the same. The remaining description of beams 9650 and 9652 is the same as corresponding portions of the description given for beams 9550 and 9552 with respect to angle displacement interferometer 9500.

The angle measured by differential angle displacement interferometer 9600 is the difference in changes in directions of propagation $[d\phi_{51}-d\phi_{53}]/2$ of the two components of input beam 9612 because of the image inversion of beam 9652 introduced by the addition of Penta prism 9635.

The remaining description of differential angle displacement interferometer 9600 is the same as corresponding portions of the description given for angle displacement interferometer 9500.

Alternatively, or additionally, other forms of angle interferometers, such as described in commonly owned U.S. Patent Applications having Ser. No. 09/842,556 filed Apr. 26, 2001 and entitled "DYNAMIC ANGLE MEASURING INTERFEROMETER," and Ser. No. 09/852,369 filed May 10, 2001 and entitled "APPARATUS AND METHOD FOR INTERFEROMETRIC MEASUREMENTS OF ANGULAR ORIENTATION AND DISTANCE TO A PLANE MIRROR OBJECT," both by Henry A. Hill, and Provisional Patent Application 60/351,496, filed on Jan. 24, 2002, entitled "INTERFEROMETERS FOR MEASURING CHANGES IN OPTICAL BEAM DIRECTION," by Henry A. Hill and Justin Kreuzer, may be incorporated in the above-described embodiments without departing from the spirit and scope of the present invention.

A number of embodiments of the invention have been described. Nevertheless, it will be understood that various modifications may be made without departing from the spirit and scope of the invention.

What is claimed is:

1. Apparatus comprising:
   a support structure;
   a stage configured to move relative to the support structure;
   a first reflection surface carried by one of the support structure and the stage; and
   a first interferometry system configured to direct a first measurement beam to contact the first reflection surface and monitor changes in the position and orientation of the stage relative to the support structure along multiple degrees of freedom using the first measurement beam and no other measurement beam that contacts the first reflection surface.

2. The apparatus of claim 1, wherein the first measurement beam defines a first measurement axis and wherein the multiple degrees of freedom comprise at least two of distance along the first measurement axis, pitch about the first measurement axis, and yaw about the first measurement axis.

3. The apparatus of claim 1, wherein the first interferometry system comprises a single measurement beam interferometer (SMBI) which during operation maintains the first measurement beam normal to the first reflection surface over a range of angular orientations of the stage relative to the support structure.

4. The apparatus of claim 3, wherein the SBMI in the first interferometry system directs the first measurement beam to contact the first reflection surface only once.

5. The apparatus of claim 3, wherein the SBMI in the first interferometry system directs the first measurement beam to contact the first reflection surface multiple times.

6. The apparatus of claim 1, wherein the first interferometry system combines at least portion of the first measurement beam reflected from the first reflection surface with a reference beam to produce an interferometric signal indicative of a change in optical path length.

7. The apparatus of claim 3, wherein the SMBI in the first interferometry system determines an angular orientation of the stage relative to the support structure based information related to the direction of the measurement beam.

8. The apparatus of claim 7, wherein the SMBI comprises an angle measuring interferometer to interferometrically monitor the direction of the measurement beam.

9. The apparatus of claim 3, wherein the SMBI is a passive SMBI which is configured to direct an input beam to reflect at least once from the first reflection surface and then separate the input beam into the first measurement beam and at least one other beam.

10. The apparatus of claim 9, wherein the passive SMBI comprises a beam conditioning portion for directing the input beam to reflect from the first reflection surface and an afocal magnification or demagnification system to scale the change in propagation direction imparted to the input beam after it reflects from the first reflection surface.

11. The apparatus of claim 3, wherein the SMBI is a dynamic SMBI which comprises a dynamic beam steering element that is servo-ed to the orientation of the first reflection surface to maintain the first measurement beam normal to the first reflection surface over the range of angular orientations of the stage relative to the support structure.

12. The apparatus of claim 11, wherein the dynamic beam steering element is positioned to direct and contact the first measurement beam.

13. The apparatus of claim 11, wherein the dynamic beam steering element is positioned to direct and contact a progenitor beam to the first measurement beam.

14. The apparatus of claim 11, wherein the dynamic beam steering element is responsive to a servo signal derived from a measurement of the propagation directions of the first measurement beam or a beam derived from the first measurement beam after it has reflected from the first reflection surface.

15. The apparatus of claim 1, further comprising a drive system for moving the stage relative to the support structure.

16. The apparatus of claim 1, wherein the first interferometry system is secured to the support structure and the first reflection surface is carried by the stage.

17. The apparatus of claim 1, wherein the first interferometry system is secured to the stage and the first reflection surface is carried by the support structure.

18. The apparatus of claim 1, further comprising a mirror having the first reflection surface, the mirror being secured to the one of the stage and the support structure.

19. The apparatus of claim 1, wherein the first reflection surface is formed by a reflecting edge surface of the stage.

20. The apparatus of claim 1, wherein the first reflection surface is formed by a reflecting edge surface of the support structure.

21. The apparatus of claim 1, wherein the first interferometry system comprises a photodetector for measuring an interferometric optical signal.

22. The apparatus of claim 1, wherein the first interferometry system comprises a fiber optic pick-up for coupling an interferometric optical signal to a remote photodetector.

23. The apparatus of claim 1, wherein the stage is configured to support a semiconductor wafer.

24. The apparatus of claim 1, wherein the stage is configured to support a mask.

25. The apparatus of claim 1, further comprising an illumination source for directing radiation onto an object supported by the stage.

26. The apparatus of claim 1, further comprising
   a second reflection surface carried by one of the support structure and the stage, the second reflection surface having an orientation different than that of the first reflection surface, and
   a second interferometry system configured to direct a second measurement beam to contact the second reflection surface and monitor changes in the position and orientation of the stage relative to the support structure along multiple degrees of freedom using the second measurement beam and no other measurement beam that contacts the second reflection surface.

27. The apparatus of claim 26, further comprising a light source providing an input beam to each of the interferometry systems.

28. The apparatus of claim 26, wherein the first and second reflection surfaces are each positioned on different sides of the stage.

29. The apparatus of claim 28, wherein the first and second interferometry systems are each secured to the support structure.

30. The apparatus of claim 26, wherein the first and second reflection surfaces are each carried by the support structure and have substantially orthogonal orientations.

31. The apparatus of claim 30, wherein the first and second interferometry systems are each secured to the stage.

32. The apparatus of claim 26, wherein the first and second interferometry systems monitor changes in the position of the stage relative to the support structure along five degrees of freedom.

33. The apparatus of claim 32, wherein the five degrees of freedom are distance along each of two orthogonal axes, orientation about each of the two orthogonal axes, and an orientation about a third axis that is orthogonal to each of the first two orthogonal axes.

34. The apparatus of claim 26, further comprising a third interferometry system for monitoring translations of the stage along an azimuthal direction.

35. The apparatus of claim 26, wherein the first and second interferometry systems share common optics.

36. Apparatus comprising:
- an object stage for carrying an object, the stage lying predominantly in the x-y plane of a Cartesian coordinate system;
- a drive for moving the object stage in at least the x-direction, the y-direction, and a rotation about the z-axis; and
- an interferometry system configured to monitor changes in the position of the stage along each of the x- and y-axes and changes in orientation about each of the x-, y-, and z-axes using fewer than five measurement axes.

37. The apparatus of claim 36, wherein the interferometry system comprises interferometer mirrors positioned relative to two edges of the stage.

38. The apparatus of claim 37, wherein the interferometer mirrors are reflecting edge surfaces of the stage.

39. The apparatus of claim 37, wherein the interferometer mirrors are stick mirrors attached to the stage.

40. The apparatus of claim 36, wherein the interferometry system comprises interferometer mirrors formed on a reference support structure.

41. The apparatus of claim 40, wherein the interferometry system is carried by the stage.

42. The apparatus of claim 40, wherein the interferometry system is secured to a second reference support structure.

43. The apparatus of claim 40, further comprising an interferometer configured to monitor the z-position of the stage.

\* \* \* \* \*

UNITED STATES PATENT AND TRADEMARK OFFICE
CERTIFICATE OF CORRECTION

PATENT NO. : 6,912,054 B2
DATED : June 28, 2005
INVENTOR(S) : Henry A. Hill

It is certified that error appears in the above-identified patent and that said Letters Patent is hereby corrected as shown below:

Title page,
Item [60], Related U.S. Application Data, replace "60/615,574" with
-- 60/315,574 --.
Item [57], ABSTRACT,
Line 1, replace "an apparatus" with -- An apparatus --.

Signed and Sealed this

Thirty-first Day of January, 2006

JON W. DUDAS
*Director of the United States Patent and Trademark Office*